US012813249B2

(12) United States Patent
Choi et al.

(10) Patent No.: US 12,813,249 B2
(45) Date of Patent: Nov. 24, 2026

(54) SEMICONDUCTOR DEVICE SEMICONDUCTOR DEVICE INCLUDING KEY PATTERNS AND A VIA STRUCTURE AT THE SAME LEVEL AND METHOD OF MANUFACTURING THE SAME AND METHOD OF MANUFACTURING THE SAME

(71) Applicant: Samsung Electronics Co., Ltd., Suwon-si (KR)

(72) Inventors: Kyuhoon Choi, Suwon-si (KR); Seungseok Ha, Suwon-si (KR); Seowoo Nam, Suwon-si (KR)

(73) Assignee: Samsung Electronics Co., Ltd.

( * ) Notice: Subject to any disclaimer, the term of this patent is extended or adjusted under 35 U.S.C. 154(b) by 341 days.

(21) Appl. No.: 18/421,431

(22) Filed: Jan. 24, 2024

(65) Prior Publication Data

US 2024/0363526 A1 Oct. 31, 2024

(30) Foreign Application Priority Data

Apr. 28, 2023 (KR) ........................ 10-2023-0056304

(51) Int. Cl.
*H10W 20/42* (2026.01)
*H10B 12/00* (2023.01)
(Continued)

(52) U.S. Cl.
CPC ............ *H10W 20/42* (2026.01); *H10B 12/09* (2023.02); *H10B 12/50* (2023.02); *H10B 41/30* (2023.02);
(Continued)

(58) Field of Classification Search
CPC ........ H10B 12/09; H10B 12/50; H10B 41/30; H10B 41/42; H10B 43/40; H10W 46/00; H10W 46/301; H10W 20/42; H10W 20/43
See application file for complete search history.

(56) References Cited

U.S. PATENT DOCUMENTS 8,008,788 B2 8/2011 Koketsu et al.
9,245,851 B2 * 1/2016 Nishikawa ........ H10W 20/0698
(Continued)

FOREIGN PATENT DOCUMENTS

JP 2002-299588 A 10/2002
KR 10-2009-0019133 A 2/2009

*Primary Examiner* — William B Partridge
*Assistant Examiner* — Heim Kirin Grewal
(74) *Attorney, Agent, or Firm* — HARNESS, DICKEY & PIERCE, P.L.C.

(57) ABSTRACT

A semiconductor device according to some example embodiments may include: a substrate having a first region and a second region; a lower interlayer insulating layer on the first region and the second region of the substrate; an upper interlayer insulating layer on the lower interlayer insulating layer; a via structure penetrating through the upper interlayer insulating layer in the first region; a plurality of metal wirings extending in a first direction on the via structure and electrically connected to the via structure; trenches on a same level as that of the via structure and in the upper interlayer insulating layer, in the second region; and a dummy wiring layer having a curved structure along upper surfaces of the trenches, the upper interlayer insulating layer, and the lower interlayer insulating layer.

20 Claims, 19 Drawing Sheets

(51) Int. Cl.

| | |
|---|---|
| ***H10B 41/30*** | (2023.01) |
| ***H10B 41/42*** | (2023.01) |
| ***H10B 43/30*** | (2023.01) |
| ***H10B 43/40*** | (2023.01) |
| ***H10W 20/41*** | (2026.01) |
| ***H10W 46/00*** | (2026.01) |

(52) U.S. Cl.

CPC ............. *H10B 41/42* (2023.02); *H10B 43/30* (2023.02); *H10B 43/40* (2023.02); *H10W 20/435* (2026.01); *H10W 46/00* (2026.01); *H10W 46/301* (2026.01)

(56) References Cited

U.S. PATENT DOCUMENTS

| | | | | |
|---|---|---|---|---|
| 10,847,574 | B2 | 11/2020 | Wang et al. | |
| 11,145,602 | B2 | 10/2021 | Li et al. | |
| 2015/0228538 | A1* | 8/2015 | Wada | H10W 20/057<br>257/774 |
| 2017/0179037 | A1* | 6/2017 | Lee | H10D 1/68 |
| 2017/0372960 | A1 | 12/2017 | Mebarki et al. | |
| 2020/0185597 | A1 | 6/2020 | Li et al. | |
| 2024/0021535 | A1* | 1/2024 | Huang | H10D 30/014 |

* cited by examiner

SEMICONDUCTOR DEVICE SEMICONDUCTOR DEVICE INCLUDING KEY PATTERNS AND A VIA STRUCTURE AT THE SAME LEVEL AND METHOD OF MANUFACTURING THE SAME AND METHOD OF MANUFACTURING THE SAME

CROSS-REFERENCE TO RELATED APPLICATION(S)

This application claims the benefit of priority to Korean Patent Application No. 10-2023-0056304 filed on Apr. 28, 2023, in the Korean Intellectual Property Office, the subject matter of which is hereby incorporated by reference in its entirety.

BACKGROUND

The present disclosure relates to a semiconductor device and a method of manufacturing the same.

In various semiconductor devices such as a logic circuit and a memory, an interconnection structure (e.g., a back end of line (BEOL)) for connecting various conductive elements disposed on different levels, such as a conductive line of the back end of line (BEOL) or a contact plug connected to an active region such as a source and a drain, may be used. Recently, with the high integration of semiconductor devices, various studies have been conducted to form an interconnection structure by a subtractive etching process in contrast to a damascene process, simultaneously with reducing a line width and/or a pitch.

SUMMARY

An aspect of the present disclosure is to provide a semiconductor device having improved integration and electrical properties and a manufacturing method thereof.

According to an aspect of the present disclosure, a semiconductor device may include: a substrate having a first region and a second region; an active region extending in a first direction on the first region of the substrate; a device isolation layer on the first region and the second region of the substrate and configured to define the active region in the first region; a gate structure on the active region and extending in a second direction, intersecting the first direction; a source/drain region on the active region on both sides of the gate structure; a lower interlayer insulating layer on the device isolation layer and configured to cover the gate structure and the source/drain region in the first region; a contact structure penetrating through the lower interlayer insulating layer and connected to the source/drain region; a first upper interlayer insulating layer configured to cover the lower interlayer insulating layer and the contact structure; a via structure on the first upper interlayer insulating layer and connected to the contact structure; a plurality of metal wirings extending in the first direction on the first upper interlayer insulating layer and electrically connected to the via structure; a first stopper layer in contact with lower surfaces of the plurality of metal wirings and between the lower surfaces of the plurality of metal wirings and an upper surface of the via structure; key patterns on a same level as that of the via structure, in the second region; a dummy wiring layer configured to cover the key patterns and have a curved structure along the first upper interlayer insulating layer and the key patterns; and a second upper interlayer insulating layer on the first upper interlayer insulating layer and configured to cover side surfaces of the plurality of metal wirings and the dummy wiring layer.

According to an aspect of the present disclosure, a semiconductor device may include: a substrate having a first region and a second region; a lower interlayer insulating layer on the first region and the second region of the substrate; an upper interlayer insulating layer on the lower interlayer insulating layer; a via structure penetrating through the upper interlayer insulating layer in the first region; a plurality of metal wirings extending in a first direction on the via structure and electrically connected to the via structure; trenches on a same level as that of the via structure and in the upper interlayer insulating layer, in the second region; and a dummy wiring layer having a curved structure along the trenches, the upper interlayer insulating layer, and upper surface of the lower interlayer insulating layer.

According to an aspect of the present disclosure, a method of manufacturing a semiconductor device may include: forming a lower interlayer insulating layer on a substrate having a first region and a second region; forming an upper interlayer insulating layer on the lower interlayer insulating layer; forming a via structure penetrating through the upper interlayer insulating layer, in the first region; forming key patterns penetrating through the upper interlayer insulating layer, in the second region; sequentially forming a stopper layer on the via structure and the key patterns, a buffer layer on the stopper layer, and an anti-reflection layer on the buffer layer; forming a photoresist layer on the anti-reflection layer; forming an open region by removing a portion of the photoresist layer, in the second region; forming trenches by removing the photoresist layer in the first region and second region, and removing the anti-reflection layer, the buffer layer and the stopper layer in a region vertically overlapping the open region, and exposing an upper surface of the key patterns; removing the anti-reflection layer and the buffer layer in regions except for the open region, and removing at least a portion of the stopper layer; forming a metal wiring layer covering the stopper layer in the first region; forming a dummy wiring layer along an upper surface and a side surface of the upper interlayer insulating layer and the trenches, in the second region, and forming a plurality of metal wirings by removing a portion of the metal wiring layer, in the first region.

In a semiconductor device according to some example embodiments of the present disclosure, a dummy wiring layer may form a path difference of light through a structure having a step portion, in a peripheral region, when there is exposure for alignment, thereby providing a semiconductor device with improved integration and electrical characteristics by aligning a plurality of metal wirings, a via structure, and a contact structure.

Advantages and effects of the present application are not limited to the foregoing content and may be more easily understood in the process of describing some example embodiments of the present disclosure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, some example embodiments of the present disclosure will be described with reference to the accompanying drawings. Hereinafter, it may be understood that the expressions such as "on," "above," "upper," "below", "beneath," "lower," and "side," are merely indicated based on drawings, except that they are indicated by drawings and referred to separately.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Figure 1:
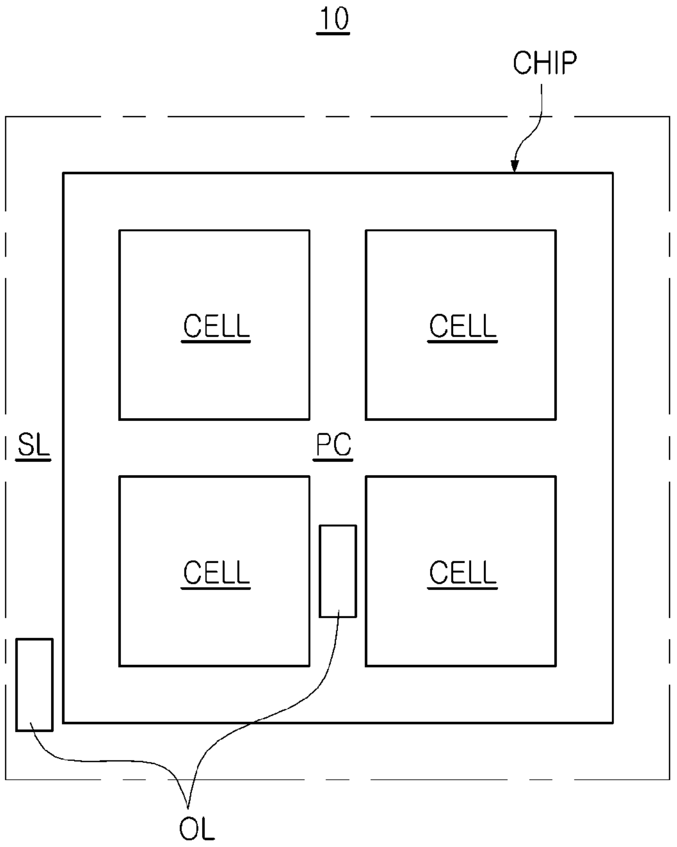
FIG. 1 is a schematic plan view of a semiconductor wafer on which a semiconductor device is formed according to some example embodiments.

FIG. 1 is a schematic plan view of a semiconductor wafer on which a semiconductor device is formed according to some example embodiments.

Referring to FIG. 1, a semiconductor wafer 10 may include a semiconductor chip region CHIP and a scribe lane region SL between the semiconductor chip regions CHIP. Furthermore, the semiconductor chip region CHIP may include a cell region CELL and a peripheral circuit region PC. That is, one or more cell regions CELL and peripheral circuit regions PC may form one semiconductor chip region CHIP, and the scribe lane region SL may be disposed to surround the semiconductor chip regions CHIP.

In the cell region CELL, a semiconductor memory cell array, for example, a volatile memory cell array such as a DRAM, or a nonvolatile memory cell array such as a flash memory may be formed. Peripheral circuits electrically connected to cell arrays formed in the cell region CELL may be formed in the peripheral circuit region PC.

Although FIG. 1 illustrates that the peripheral circuit region PC surrounds the cell region CELL, the present invention is not limited by such an arrangement, and the cell region CELL and the peripheral circuit region PC may have any suitable arrangement. According to some example embodiments, a portion of the peripheral circuit region PC may be disposed in the cell region CELL. Furthermore, the number of cell regions CELL forming one semiconductor chip region CHIP is not limited to those illustrated.

The scribe lane region SL corresponds to a region for performing a dicing process of separating the semiconductor wafer 10 into each semiconductor chip after forming semiconductor elements in the semiconductor chip region CHIP. The scribe lane region SL may include a key area OL as illustrated. The key region OL may include alignment keys or overlay keys used in exposure processes performed to form the semiconductor elements on the semiconductor chip region CHIP. A position in which the key region OL is disposed is not limited to those illustrated in the drawings, and may be disposed in the semiconductor chip region CHIP according to some example embodiments.

Figure 2:
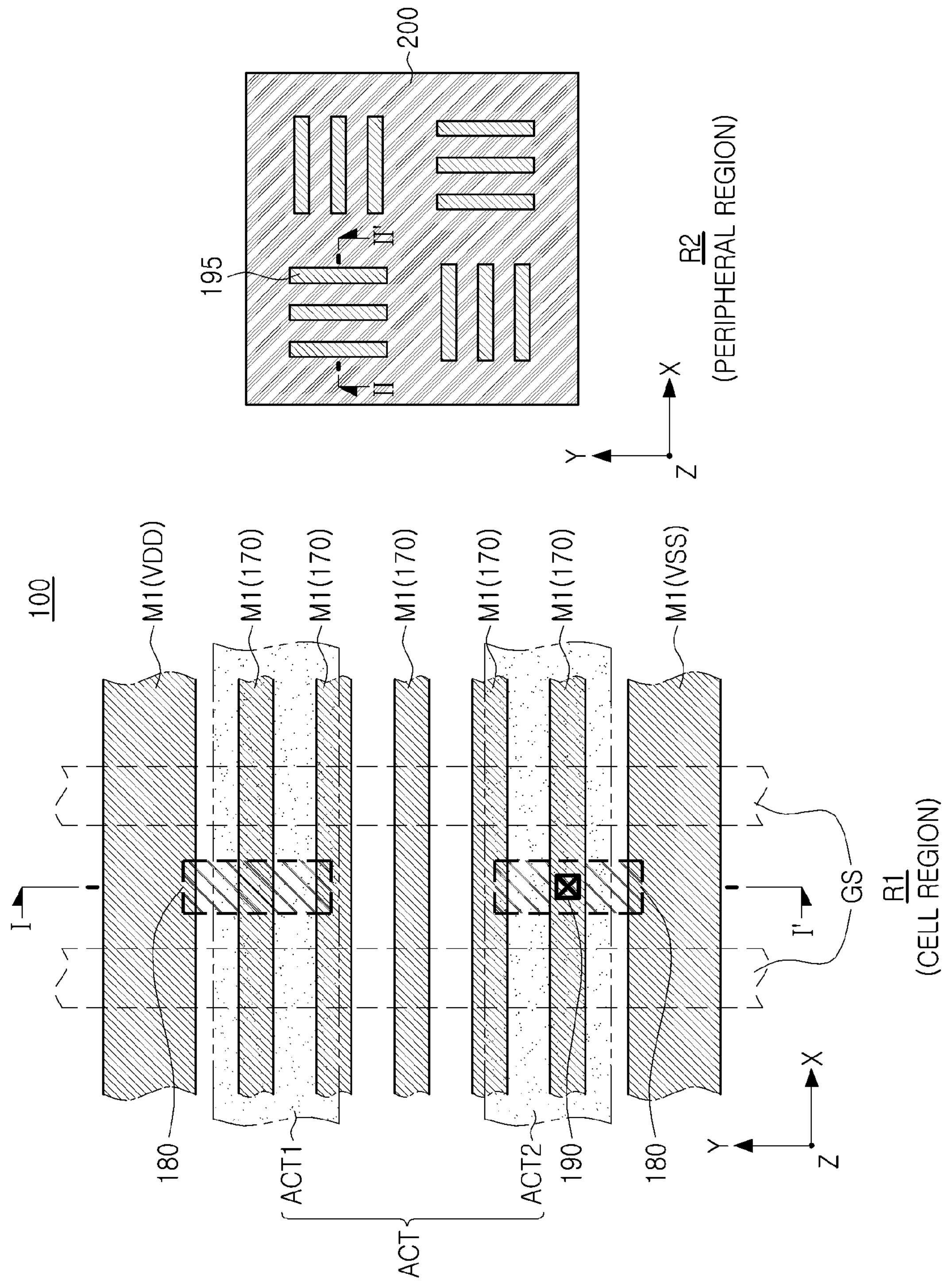
FIG. 2 is a schematic enlarged plan view of a semiconductor device according to some example embodiments.
Figure 3A:
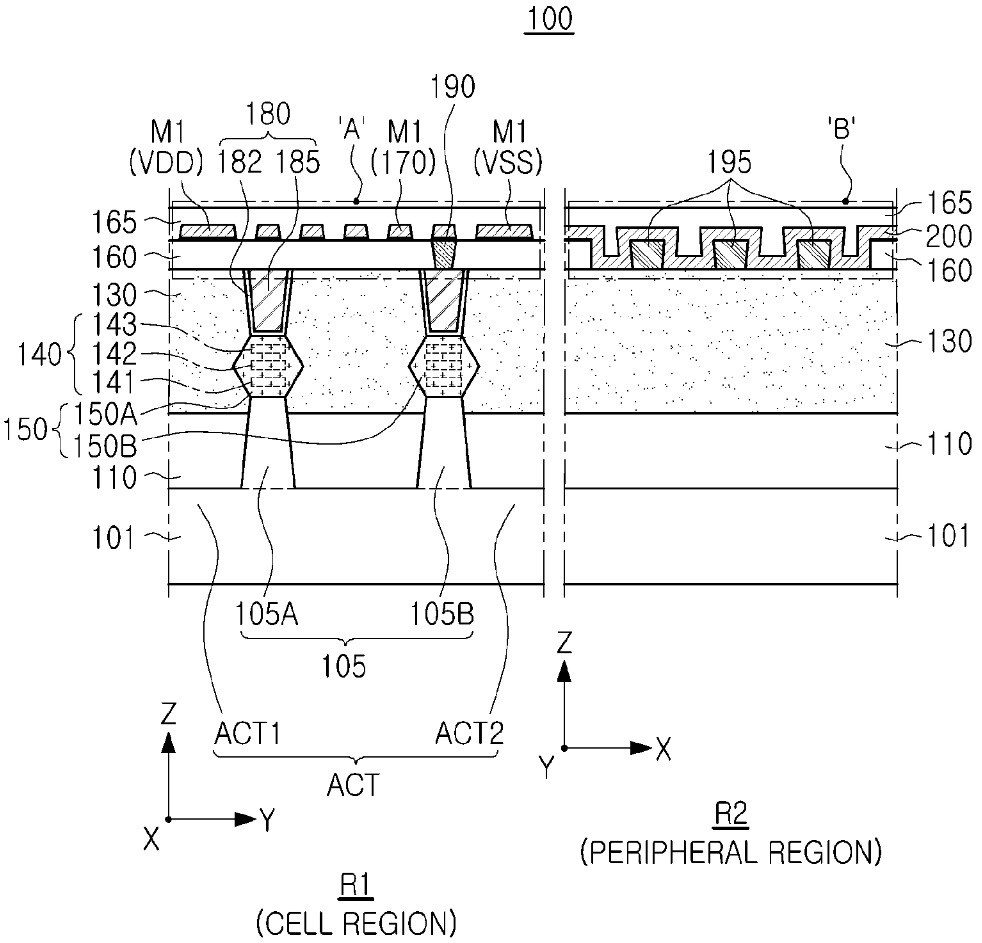
FIG. 3A is a schematic cross-sectional view of a semiconductor device according to some example embodiments.
Figure 3B:
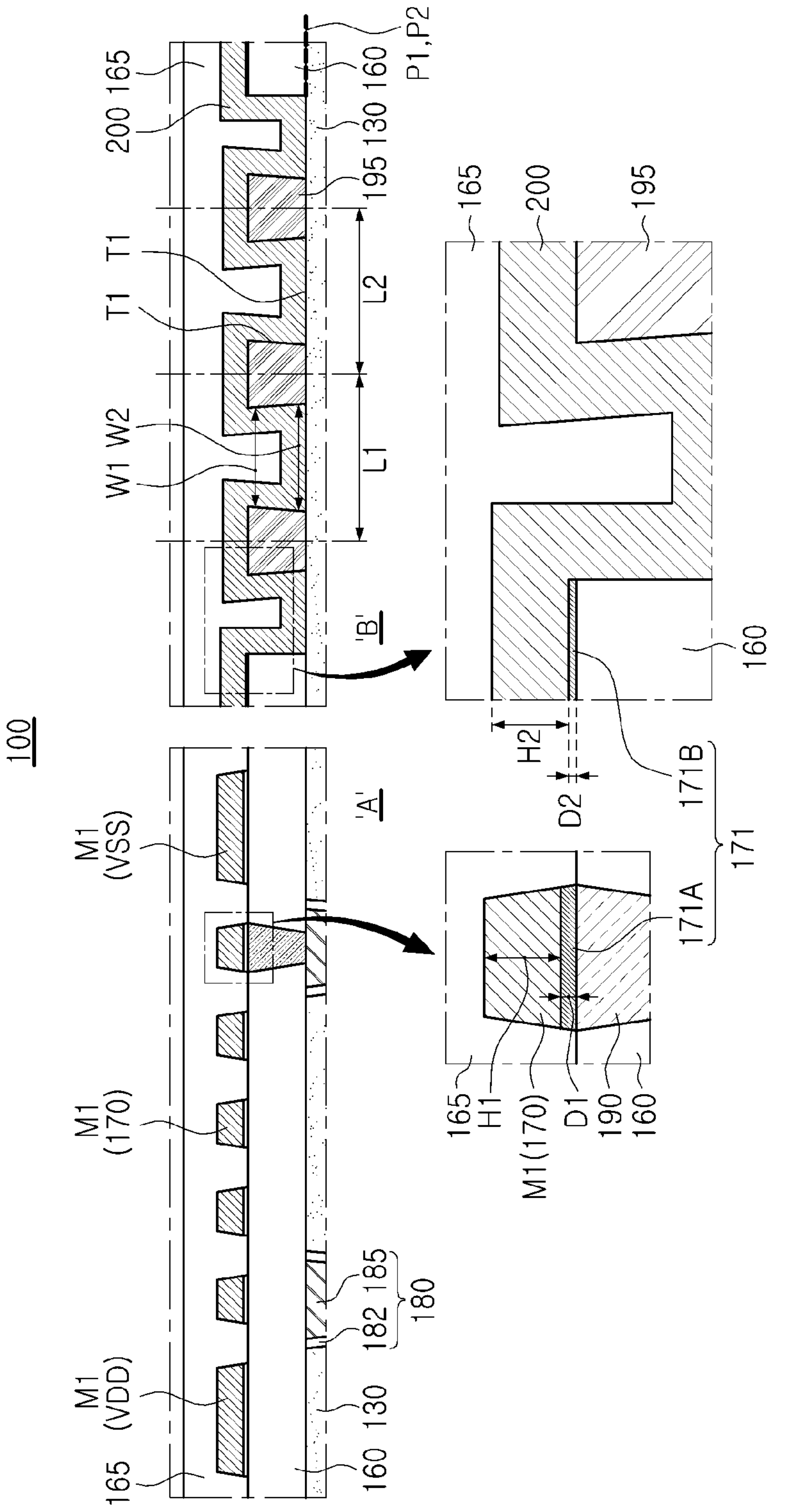
FIG. 3B is a partially enlarged view schematically illustrating a semiconductor device according to some example embodiments.

FIG. 2 is a schematic enlarged plan view of a semiconductor device according to some example embodiments. FIG. 3A is schematic cross-sectional views illustrating a semiconductor device according to some example embodiments. FIG. 3B is partially enlarged views schematically illustrating a semiconductor device according to some example embodiments. FIG. 2 is plan views illustrated by enlarging an arbitrary first region R1 among cell regions CELL and a second region R2 as an arbitrary region among peripheral regions PC in FIG. 1. FIG. 3A is a cross-section taken along a cut line I-I' and a cross-section along a cut line II-II' in FIG. 2. FIG. 3B is an enlarged view of region 'A' and region 'B' in FIG. 3A. The cell region may include a cell region CELL described with reference to FIG. 1, and the peripheral region may include a peripheral circuit region PC or a scribe lane region SL described with reference to FIG. 1.

Referring to FIGS. 2, 3A and 3B, a semiconductor device 100 according to some example embodiments may include a substrate 101 having a first region R1 and a second region R2, an active region ACT extending in a first direction (e.g., an X-direction) on the substrate 101 in the first region R1, gate structures GS disposed on the active region ACT and extending in a second direction (e.g., a Y-direction) intersecting the first direction (e.g., the X-direction), a source/drain region 150 disposed on the active region ACT on both sides of the gate structure GS and in contact with a plurality of channel layers 141, 142 and 143, a contact structure 180 connected to the source/drain region 150, a via structure 190 connected to the contact structure 180, a plurality of metal wirings M1 electrically connected to the via structure 190, and a stopper layer 171 disposed below the plurality of metal wirings M1. The semiconductor device 100 may include key patterns 195 disposed on substantially the same level as that of the via structure 190 in the second region R2 and a dummy wiring layer 200 covering the key patterns 195. The semiconductor device 100 may further include a device isolation layer 110 disposed on the substrate 101, a lower interlayer insulating layer 130 disposed on the device isolation layer 110 and covering the gate structure GS and the source/drain region 150, and an upper interlayer insulating layer 160 and 165 disposed on the lower interlayer insulating layer 130.

In the semiconductor device 100, the active region ACT has a fin structure, and a gate electrode may be disposed between the active region ACT and a channel structure 140, between the plurality of channel layers 141, 142 and 143 of the channel structures 140, and in an upper portion of the channel structure 140. Accordingly, the semiconductor device 100 may include a gate-all-around type field effect transistor by the channel structure 140, the source/drain region 150, and the gate structure GS, that is, a Multi Bridge Channel FET (MBCFET™).

The substrate 101 may have an upper surface extending in the X-direction and the Y-direction. The substrate 101 may include a semiconductor material, for example, a Group IV semiconductor, a Group III-V compound semiconductor, and/or a Group II-VI compound semiconductor. For example, the Group IV semiconductor may include silicon, germanium, or silicon-germanium. The substrate 101 may be provided as a bulk wafer, an epitaxial layer, a silicon on insulator (SOI) layer, or a semiconductor on insulator (SeOI) layer. The substrate 101 may have a first region R1 and a second region R2. According to an some example embodiments, the first region R1 may be a cell region, and the second region R2 may include at least one of an alignment key region and an overlay key region.

The substrate 101 may include active regions ACT disposed on an upper portion thereof. However, according to a description method, the active regions ACT may be described in a separate configuration from the substrate 101. The substrate 101 may include the first region R1 and the second region R2.

The active regions ACT may be defined by the device isolation layer 110 within the substrate 101, and the active regions ACT may be disposed to extend in the first direction, for example, the X-direction. According to some example embodiments, the active regions ACT may include a first active region ACT1 and a second active region ACT2. Each of the active regions ACT may include active fins 105 protruding from the substrate 101. According to some example embodiments, the first active region ACT1 may include first active fins 105A, and the second active region ACT2 may include second active fins 105B. Upper ends of the active fins 105 may be disposed to protrude from an upper surface of the device isolation layer 110 to a predetermined height. The active fins 105 may be formed as a portion of the substrate 101, or may include an epitaxial layer grown from the substrate 101. The active fins 105 may be partially recessed on both sides of the gate structures GS, and the source/drain region 150 may be disposed on the recessed active fins 105. According to some example embodiments, the active regions ACT may have doping regions including impurities. For example, the active fins 105 may include impurities diffused from the source/drain region 150 in a region in contact with the source/drain region 150. In some example embodiments, the first active region ACT1 may be a PMOS region, and the second active region ACT2 may be an NMOS region, but the present disclosure is not limited thereto.

The channel structure 140 may include first to third channel layers 141, 142 and 143, which are two or more channel layers spaced apart from each other in a direction, perpendicular to an upper surface of the active fins 105 on the active region ACT, for example, in a Z-direction. The first to third channel layers 141, 142 and 143 may be connected to the source/drain region 150 and may be spaced apart from the upper surface of the active fins 105. The first to third channel layers 141, 142 and 143 may have a width equal to or similar to that of the active fins 105 in the Y-direction, and may have a width equal to or similar to that of the gate structure GS in the X-direction. However, according to some example embodiments, the first to third channel layers 141, 142 and 143 may have a reduced width so that side surfaces thereof are disposed below the gate structure GS in the X-direction. The first to third channel layers 141, 142 and 143 may be formed of a semiconductor material, for example, at least one of silicon (Si), silicon germanium (SiGe), and germanium (Ge). The first to third channel layers 141, 142 and 143 may be formed of, for example, the same material as the substrate 101.

The gate structure GS may have a line shape extending in the second direction (e.g., the Y-direction). The gate structure GS may be disposed in one region of the active region ACT. The gate structure GS may include gate spacers, a gate dielectric layer and a gate electrode sequentially disposed between the gate spacers, and a gate capping layer disposed on the gate electrode. For example, the gate spacers may include an insulating material such as SiOCN, SiON, SiCN, or SiN. The gate dielectric layer may be formed of, for example, a silicon oxide film, a high dielectric film, or combinations thereof. The high dielectric film may include a material having a higher dielectric constant than that of the silicon oxide film. For example, the high dielectric film may include a material selected from among hafnium oxide, hafnium oxynitride, hafnium silicon oxide, lanthanum oxide, lanthanum aluminum oxide, and combinations thereof, but the present disclosure is not limited thereto. The gate electrode may include a conductive material, for example, a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon. In some example embodiments, the gate electrode may be a multilayer including two or more films. Furthermore, the gate capping layer may include, for example, silicon nitride, silicon oxynitride, silicon carbonitride, or silicon oxycarbonitride.

The source/drain region 150 may be disposed on the active region ACT on at least one side of the gate structure GS. The source/drain region 150 may be provided as a source region or a drain region of the transistor. The source/drain region 150 may be formed of a semiconductor material. For example, the source/drain region 150 may include at least one of silicon (Si), silicon germanium (SiGe), silicon arsenic (SiAs), silicon phosphide (SiP), and/or silicon carbide (SiC). For example, the source/drain region 150 may include silicon (Si) doped in an N-type and/or silicon germanium (SiGe) doped in a P-type. In some example embodiments, the source/drain region 150 may include a plurality of regions including elements having different concentrations and/or doping elements. According to some example embodiments, the source/drain region 150 may include a first source/drain region 150A disposed on the first active fins 105A and a second source/drain region 150B disposed on the second active fins 105B. For example, the first and second source/drain region 150A and 150B may have different conductivity types. Specifically, the first source/drain region 150A may be a P-type source/drain region 150A, and the second source/drain region 150B may be an N-type source/drain region 150B, but the present disclosure is not limited thereto.

The contact structure 180 may penetrate through the lower interlayer insulating layer 130 and may be connected to the source/drain region 150. The contact structure 180 may apply an electrical signal to the source/drain region 150 or may supply a power source. In a region not shown, a separate gate contact structure may be further disposed on the gate electrode. The contact structure 180 may extend from the top to the bottom to come into contact with the source/drain region 150. The contact structure 180 is illustrated as extending along the upper surface of the source/ drain region 150, but may be arranged to partially recess the source/drain region 150 according to some example embodiments. The contact structure 180 may have an inclined side surface in which a width of a lower portion thereof becomes less than a width of an upper portion thereof according to an aspect ratio, but the present disclosure is not limited thereto.

The contact structure 180 may further include a barrier layer 182 and a plug conductive layer 185 disposed on sidewalls. The barrier layer 182 may include, for example, a metal nitride such as titanium nitride (TiN), tantalum nitride (TaN), tungsten carbon nitride (WCN), and/or tungsten nitride (WN). The plug conductive layer 185 may include, for example, at least one of titanium (Ti), tantalum (Ta), tungsten (W), copper (Cu), aluminum (Al), cobalt (Co), ruthenium (Ru), and/or molybdenum (Mo). In some example embodiments, the number and an arrangement shape of conductive layers forming the contact structure 180 may be variously changed. A metal-semiconductor compound layer such as metal silicide, metal germanide, and/or metal silicide-germanide may be further disposed between the contact structure 180 and the source/drain region 150.

The via structure 190 may be disposed on the contact structure 180 and connected to the contact structure 180. The via structure 190 may be disposed below a plurality of metal wirings M1 (170), and the plurality of metal wirings M1 (170) may be connected to the via structure 190, respectively. The via structure 190 may be disposed between the contact structure 180 and the plurality of metal wirings M1 (170). The via structure 190 may have an inclined side surface in which a width of a lower portion thereof becomes less than a width of an upper portion thereof, but the present disclosure is not limited thereto. The via structure 190 may include, for example, at least one of titanium nitride (TiN), tantalum nitride (TaN), tungsten nitride (WN), tungsten carbon nitride (WCN), titanium (Ti), tantalum (Ta), tungsten (W), copper (Cu), aluminum (Al), cobalt (Co), ruthenium (Ru), and/or molybdenum (M).

The plurality of metal wirings M1 (170) may have a line shape or a bar shape extending in the X-direction. The plurality of metal wirings M1 (170) may have a trapezoidal shape in which an upper width thereof is less than a lower width thereof. The plurality of metal wirings M1 (170) may be disposed on the via structure 190 and connected to the via structure 190. The plurality of metal wirings M1 (170) may be electrically connected to the contact structure 180 through the via structure 190.

The plurality of metal wirings M1 (170) may include a first power line M1 (VDD) and a second power line M1 (VSS) for supplying different potentials to an element region including the active regions ACT and the gate electrode. For example, the first power line M1 (VDD) and the second power line M1 (VSS) may supply different potentials to standard cells disposed therebetween. For example, the first power line M1 (VDD) may supply a first power VDD to the standard cell, the second power line M1 (VSS) may supply a second power VSS to the standard cell, and the first power VDD may be greater than the second power VSS. The first power line M1 (VDD) and the second power line M1 (VSS) may extend in the X-direction and may be disposed to be spaced apart from each other in the Y-direction.

The plurality of metal wirings M1 (170) may include at least one of titanium nitride (TiN), tantalum nitride (TaN), tungsten nitride (WN), tungsten carbon nitride (WCN), aluminum (Al), cobalt (Co), titanium (Ti), tantalum (Ta), nickel (Ni), tungsten (W), and/or molybdenum (Mo). The plurality of metal wirings M1 (170) may include at least one noble metal material selected from the group consisting of platinum (Pt), ruthenium (Ru), and/or iridium (Ir).

The stopper layer 171 may be disposed between the plurality of metal wirings M1 and the first upper interlayer insulating layer 160 in the first region R1. The stopper layer 171 may be disposed between the dummy wiring layer 200 and the first upper interlayer insulating layer 160 in the second region R2. The stopper layer 171 may include a first stopper layer 171A in contact with a lower surface of the plurality of metal wirings M1 in the first region R1 and a second stopper layer 171B in contact with a lower surface of the dummy wiring layer 200 in the second region R2. The first stopper layer 171A may be in contact with the lower surface of the plurality of metal wirings M1, and may be disposed between the lower surface of the plurality of metal wirings M1 and an upper surface of the via structure 190. The second stopper layer 171B may be disposed below the dummy wiring layer 200 and may be in contact with at least a portion of the lower surface of the dummy wiring layer 200.

According to some example embodiments, a thickness D1 of the first stopper layer 171A may be greater than a thickness D2 of the second stopper layer 171B. This may be performed by a stripping process or an ashing process that is a process of FIG. 10D.

Since a metal wiring layer 200' (see FIG. 10E) is formed on the first stopper layer 171A and a plurality of metal wirings M1 are formed by a subtractive etching process, a side surface of the first stopper layer 171A and a side surface of each of the plurality of metal wirings M1 may form a coplanar surface. For example, the side surface of the first stopper layer 171A and the side surface of each of the plurality of metal wirings M1 may be on an extension line.

The stopper layer 171 may include, for example, metal nitrides such as titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and/or tungsten nitride (WN). In the first region R1, the first stopper layer 171A may serve to prevent or reduce in likelihood damage to the first upper interlayer insulating layer 160 and the via structure 190 in the stripping process or the ashing process. Furthermore, the first stopper layer 171A may improve the electrical characteristics of the semiconductor device 100 by facilitating adhesion with the plurality of metal wirings M1.

The key patterns 195 may be alignment keys or overlay keys required for aligning the plurality of metal wirings M1, the via structure 190, and the contact structure 180. According to some example embodiments, a width of an upper portion of each of the key patterns 195 may be greater than a width of a lower portion of each of the key patterns 195.

In the second region R2, the key patterns 195 are disposed on the lower interlayer insulating layer 130, and the key patterns 195 are formed by substantially the same process as the via structure 190, so that the key patterns 195 be disposed on substantially the same level as that of the via structure 190.

The key patterns 195 may include at least one of titanium nitride (TiN), tantalum nitride (TaN), tungsten nitride (WN), tungsten carbon nitride (WCN), titanium (Ti), tantalum (Ta), tungsten (W), copper (Cu), aluminum (Al), cobalt (Co), ruthenium (Ru), and/or molybdenum (Mo).

The key patterns 195 may be arranged as illustrated in FIG. 2, but the present disclosure is not limited thereto and the key patterns 195 may be variously changed.

The dummy wiring layer 200 may have a curved structure along the first upper interlayer insulating layer 160 and the key patterns 195. The dummy wiring layer 200 may be conformally formed along the first upper interlayer insulating layer 160 and the key patterns 195. According to some example embodiments, a level P1 of a portion of the lower surface of the dummy wiring layer 200 may be substantially the same as a level P2 of a lower surface of the key patterns 195, but the present disclosure is not limited thereto.

Figure 10A:
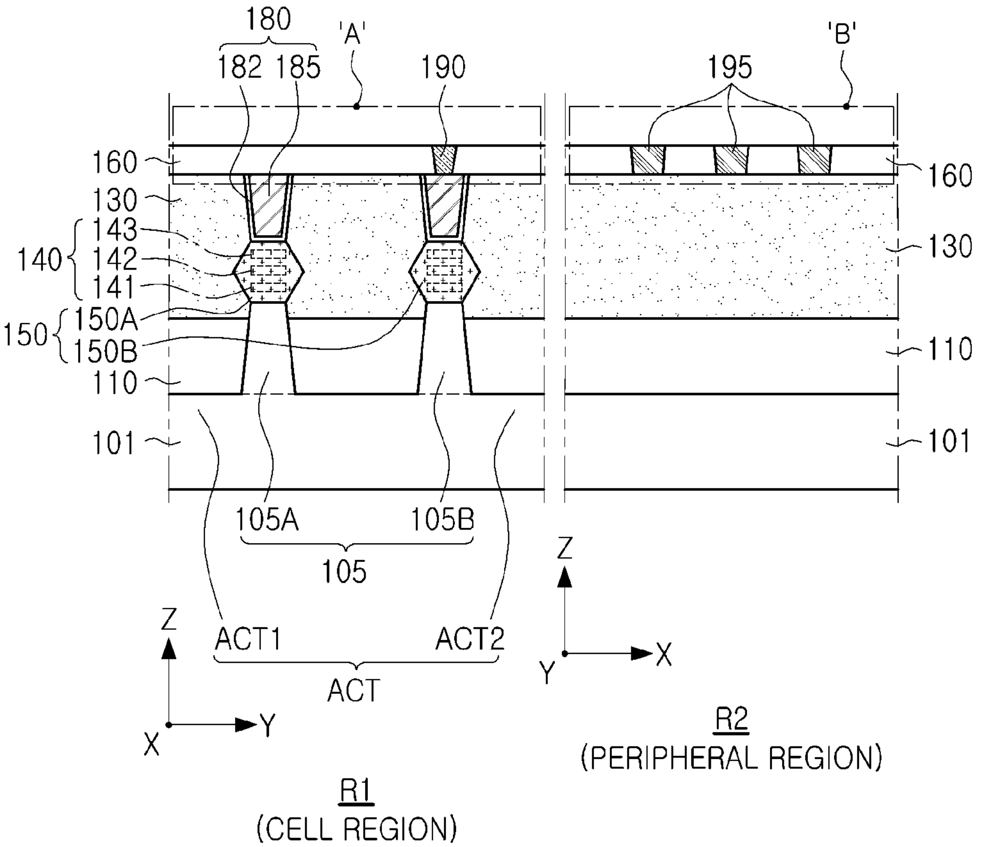
FIGS. 10A, 10B, 10C, 10D and 10E are cross-sectional views and partially enlarged views illustrated according to a process order to describe a method of manufacturing a semiconductor device according to some example embodiments.
Figure 10B:
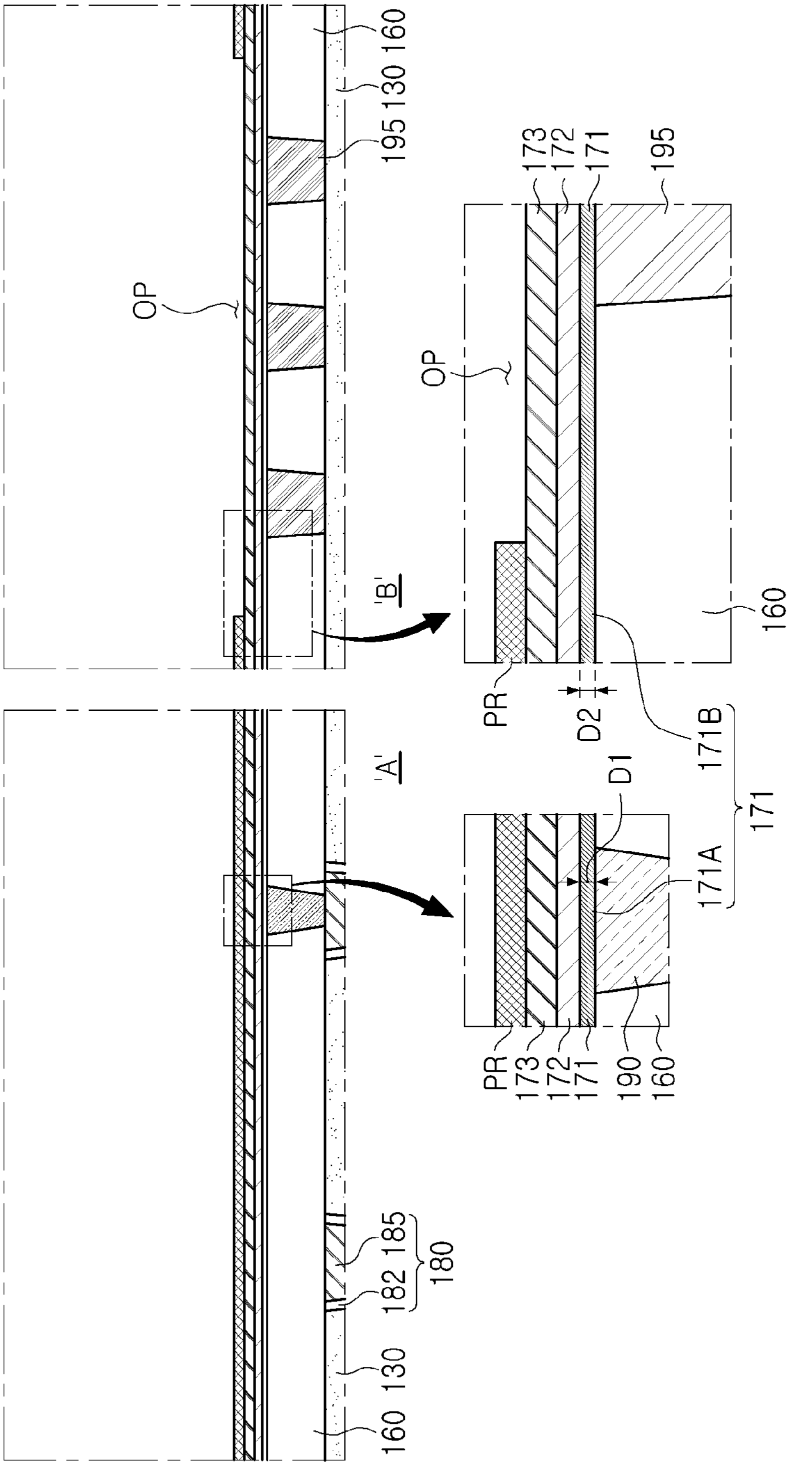
Figure 10C:
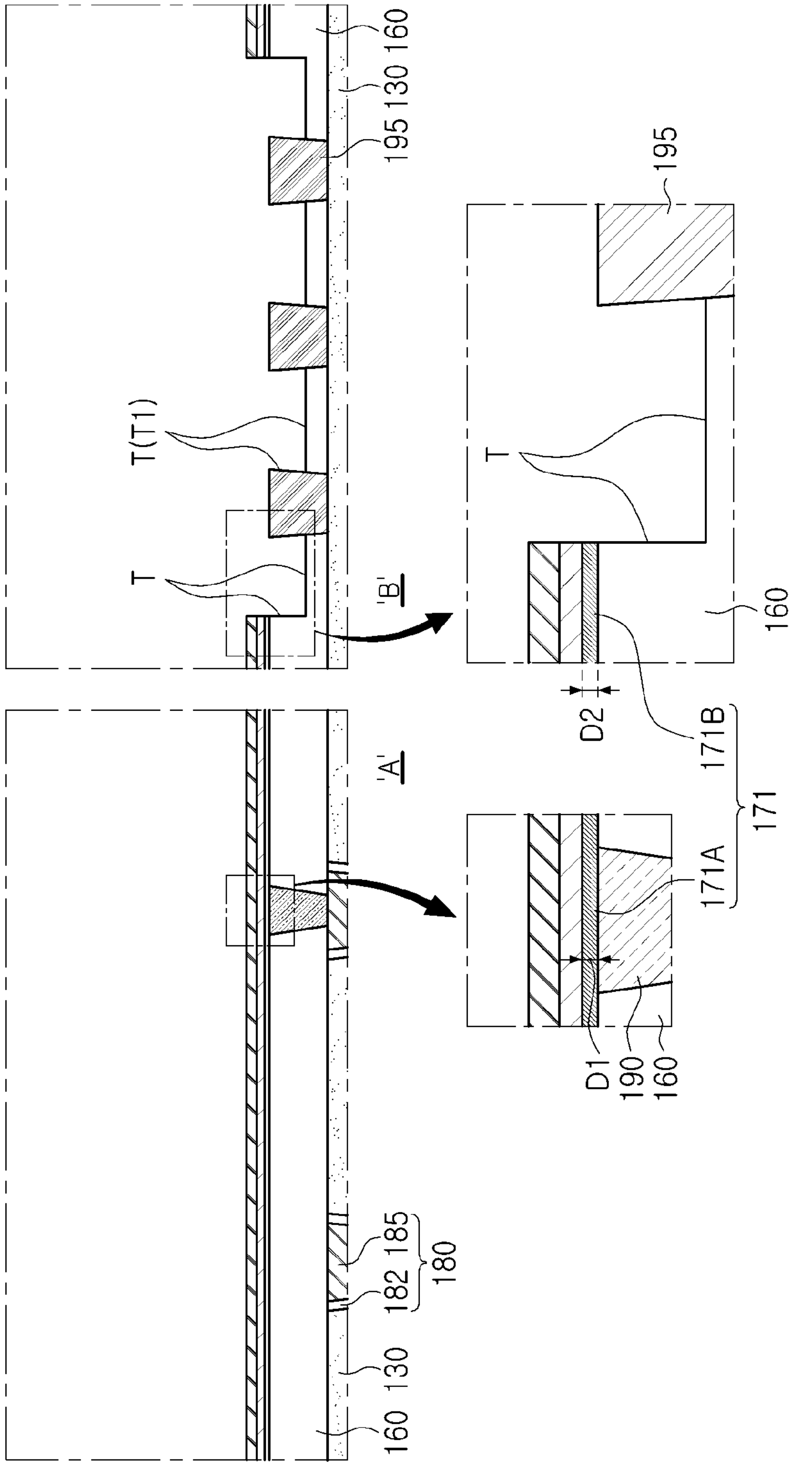
Figure 10D:
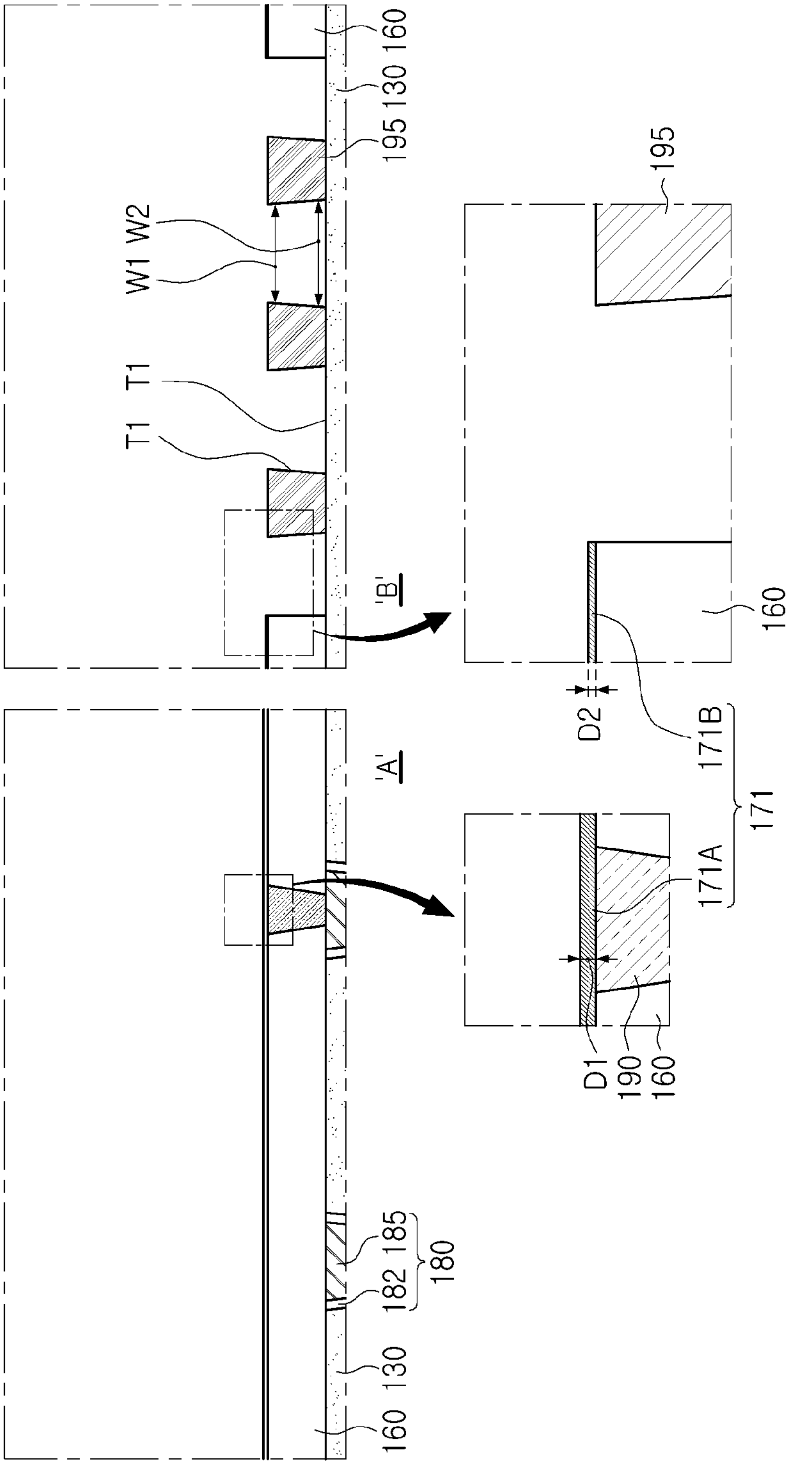
Figure 10E:
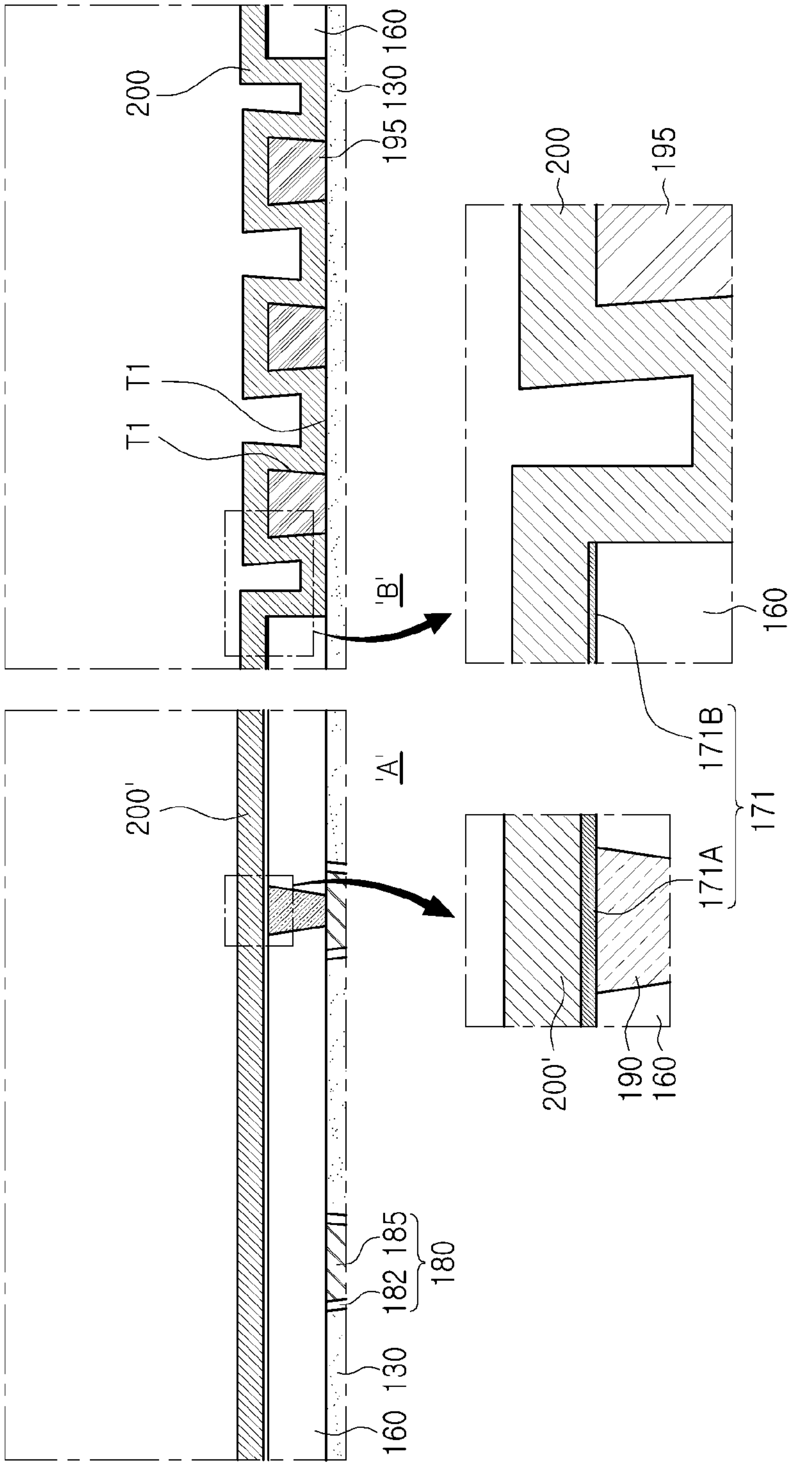

In a process of FIG. 10E, since a metal wiring layer 200' and the dummy wiring layer 200 are formed by the same process, a thickness H2 of the dummy wiring layer 200 may be substantially the same to a thickness H1 of the plurality of metal wirings M1, but the present disclosure is not limited thereto.

Trenches may include first trenches T1 disposed between the key patterns 195. According to some example embodiments, since the width of the lower portion of the key patterns 195 is less than the width of the upper portion thereof, a width W2 of a lower portion of the first trenches T1 formed between the key patterns 195 may be greater than a width W1 of an upper portion of the first trenches T1 (See FIG. 3B). The dummy wiring layer 200 may be disposed along the first trenches T1 and an upper surface and a side surface of the key patterns 195. For this reason, the dummy wiring layer 200 may have a curved structure, that is, a step portion, and when there is exposure for alignment and the like, a path difference of light reflected around the key patterns 195 may be formed.

The device isolation layer 110 may be formed by, for example, a shallow trench isolation (STI) process. The device isolation layer 110 may be disposed to extend in the X-direction in the substrate 101. The device isolation layer 110 may be formed of an insulating material, for example, an oxide, a nitride, or combinations thereof.

The lower interlayer insulating layer 130 may be disposed around the gate structure GS while partially covering the source/drain region 150. The lower interlayer insulating layer 130 may be disposed on the device isolation layer 110 and may cover the gate structure GS and the first and second source/drain region 150A and 150B. For example, the lower interlayer insulating layer 130 may be formed of flowable oxide (FOX), Tonen SilaZen (TOSZ), undoped silica glass (USG), Borosilica glass (BSG), PhosphoSilaca glass (PSG), BoroPhosphoSilica glass (BPSG), plasma enhanced tetra ethyl ortho silicate (PETEOS), fluoride silicate glass (FSG), high density plasma (HDP) oxide, plasma enhanced oxide (PEOX), flowable CVD (FCVD) oxide, and/or combinations thereof.

The upper interlayer insulating layers 160 and 165 may include a first upper interlayer insulating layer 160 covering the lower interlayer insulating layer 130 and the contact structure 180, and a second upper interlayer insulating layer 165 covering the first upper interlayer insulating layer 160, side surfaces of the plurality of metal wirings M1, and the dummy wiring layer 200. The upper interlayer insulating layers 160 and 165 may include, for example, at least one of an oxide, a nitride, and an oxynitride, and may include silicon oxide, silicon oxynitride, SiOC, SiCOH, or combinations thereof.

Figure 3C:
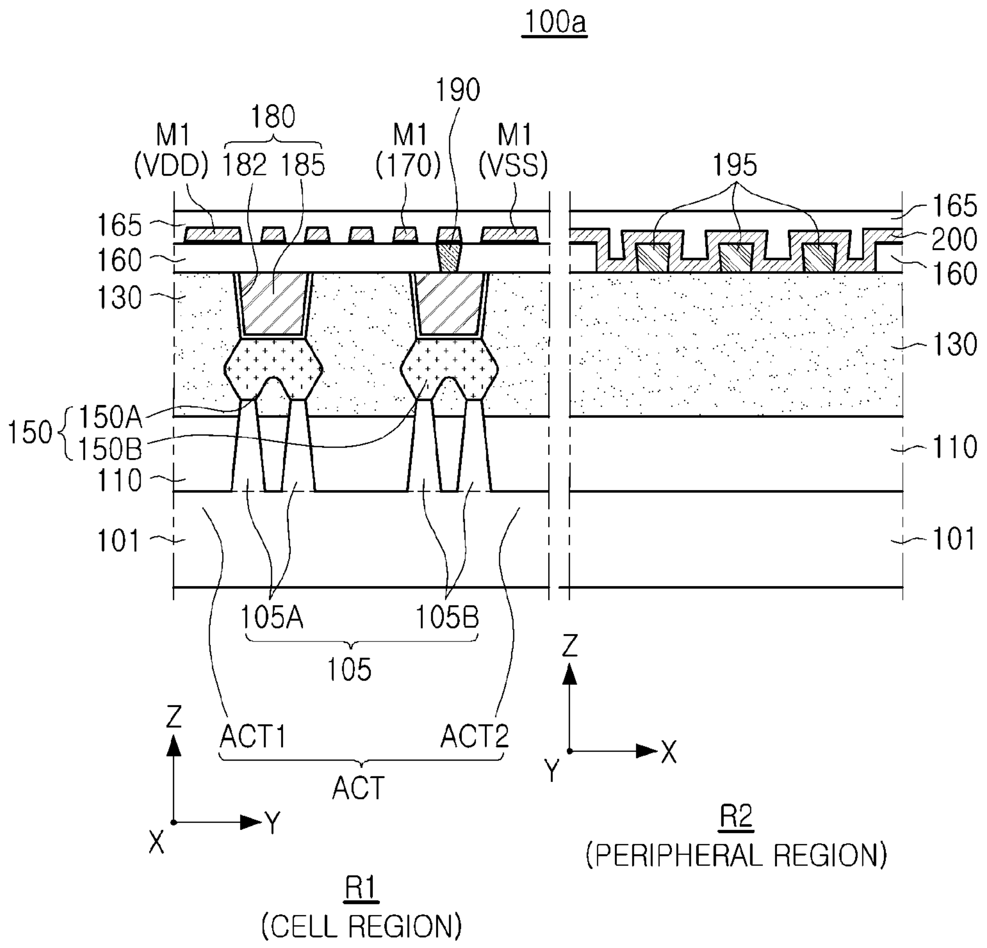
FIG. 3C is a schematic cross-sectional view of a semiconductor device according to some example embodiments.

FIG. 3C is a schematic cross-sectional view of a semiconductor device according to some example embodiments.

Referring to FIG. 3C, a semiconductor device 100*a* may include a finFET element as a transistor having active fins 105 with a fin structure of the active region ACT. The active regions ACT may include a first active region ACT1 and a second active region ACT2. In some example embodiments, the first active region ACT1 may be a PMOS region, and the second active region ACT2 may be an NMOS region, but the present disclosure is not limited thereto. According to some example embodiments, the first active region ACT1 may include first active fins 105A, and the second active region ACT2 may include second active fins 105B. The active fins 105 may include first active fins 105A and second active fins 105B. The source/drain region 150 may include a first source/drain region 150A disposed on the first active fins 105A and a second source/drain region 150B disposed on the second active fins 105B. For example, the first and second source/drain region 150A and 150B may have different conductivity types. Specifically, the first source/drain region 150A may be a P-type source/drain region 150A, and the second source/drain region 150B may be an N-type source/drain region 150B, but the present disclosure is not limited thereto. The finFET element may be an NMOS transistor or a PMOS transistor. These example embodiments described herein may be equally applied to the semiconductor device 100*a* of FIG. 3C.

FIGS. 4, 5, 6, 7, 8 and 9 are partially enlarged views schematically illustrating a semiconductor device according to some example embodiments. FIGS. 4, 5, 6, 7, 8 and 9 illustrate regions corresponding to regions 'A' and 'B' of FIG. 3B.

Figure 4:
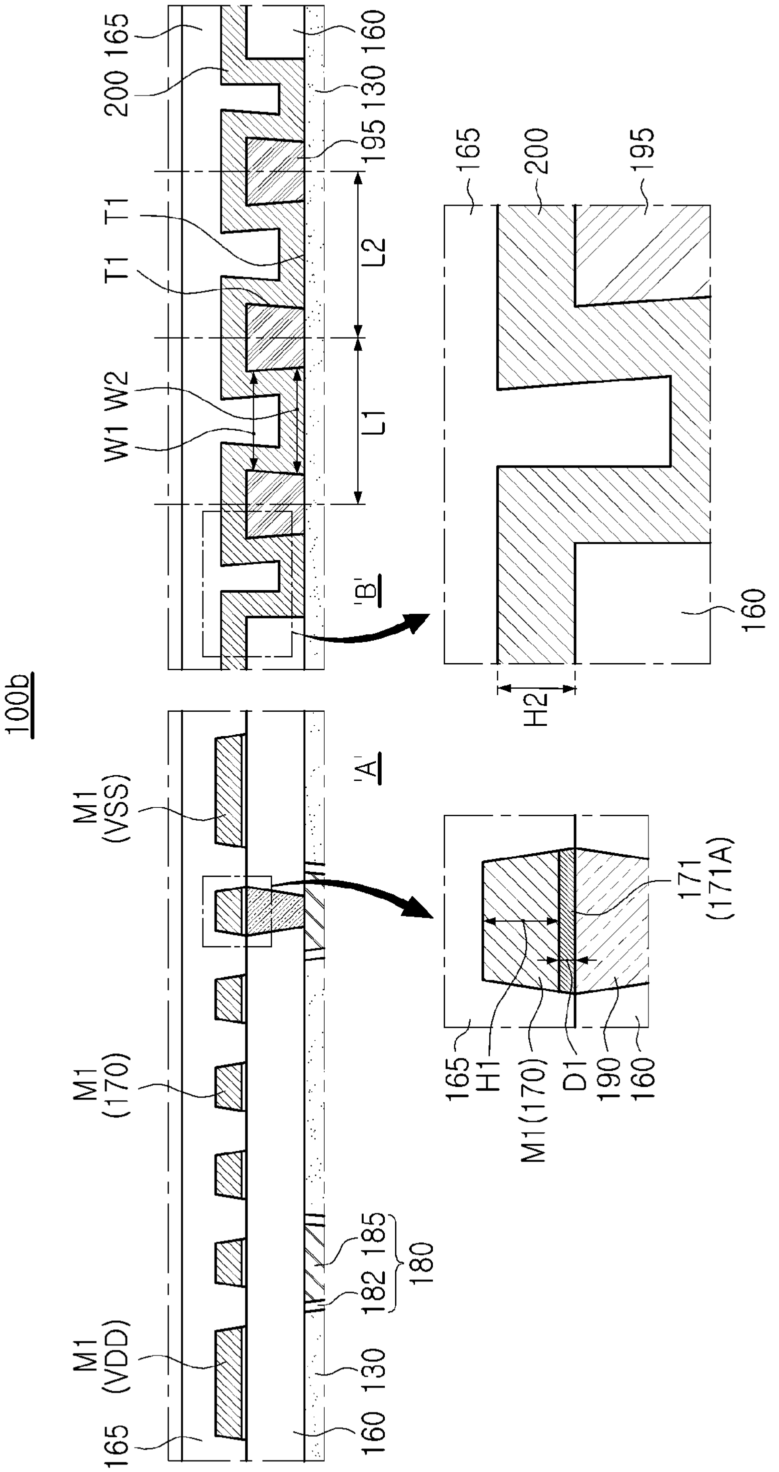
FIGS. 4, 5, 6, 7, 8 and 9 are partially enlarged views schematically illustrating a semiconductor device according to some example embodiments.

Referring to FIG. 4, unlike the semiconductor device 100 of FIG. 3B, the stopper layer 171 may not be disposed between the dummy wiring layer 200 and the first upper interlayer insulating layer 160 in the second region R2. This may be because a subsequent process is performed in a state in which the second stopper layer 171B of the second region R2 is removed during a process of performing the stripping process or ashing process as the process of FIG. 10D.

Figure 5:
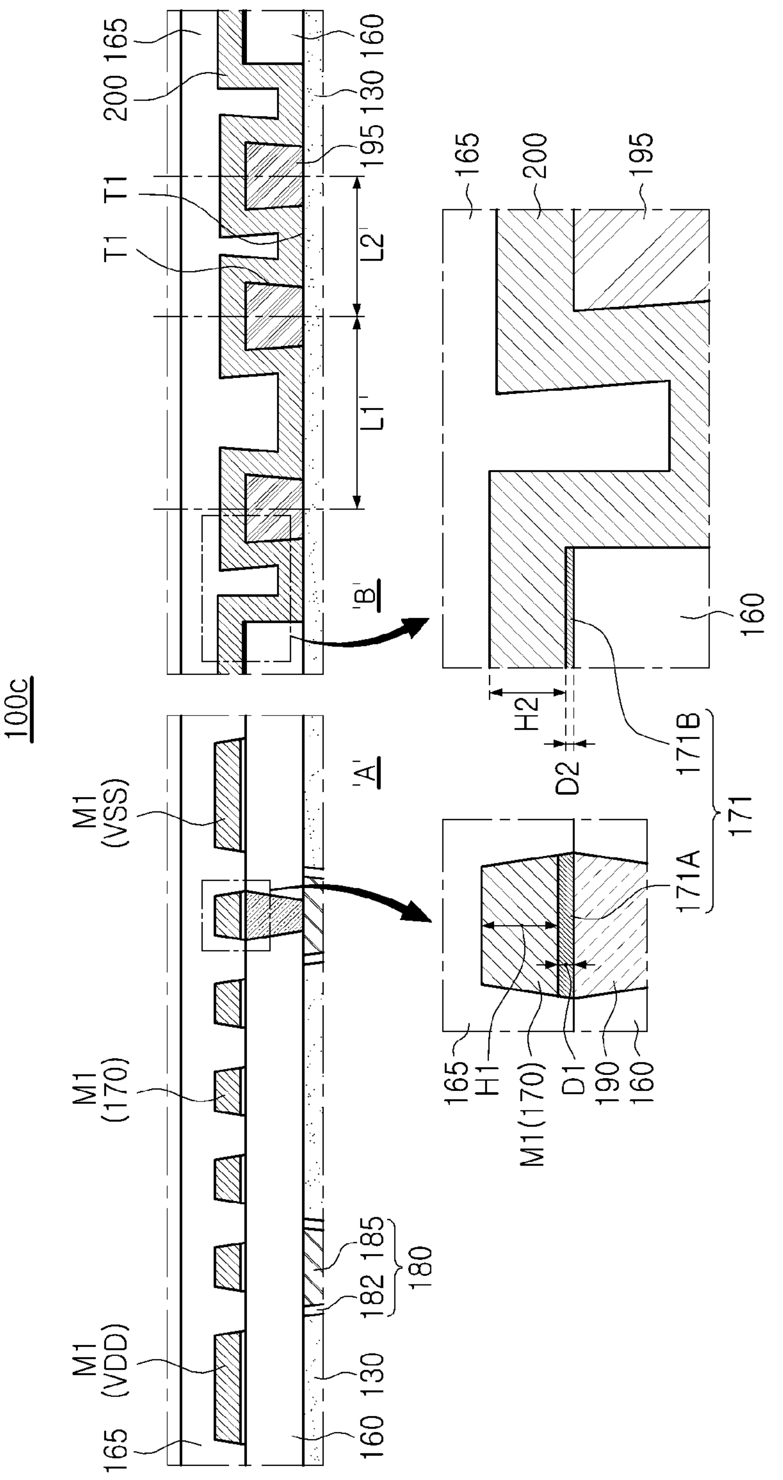

Referring to FIG. 5, a semiconductor device 100*c* may have different distances L1' and L2' between central axes of each of the key patterns 195. This may be because of the arrangement of the key patterns 195 of the second region R2 of FIG. 2. The dummy wiring layer 200 may surround the upper surface and the side surface of the key patterns 195 and may have a curved structure.

Figure 6:
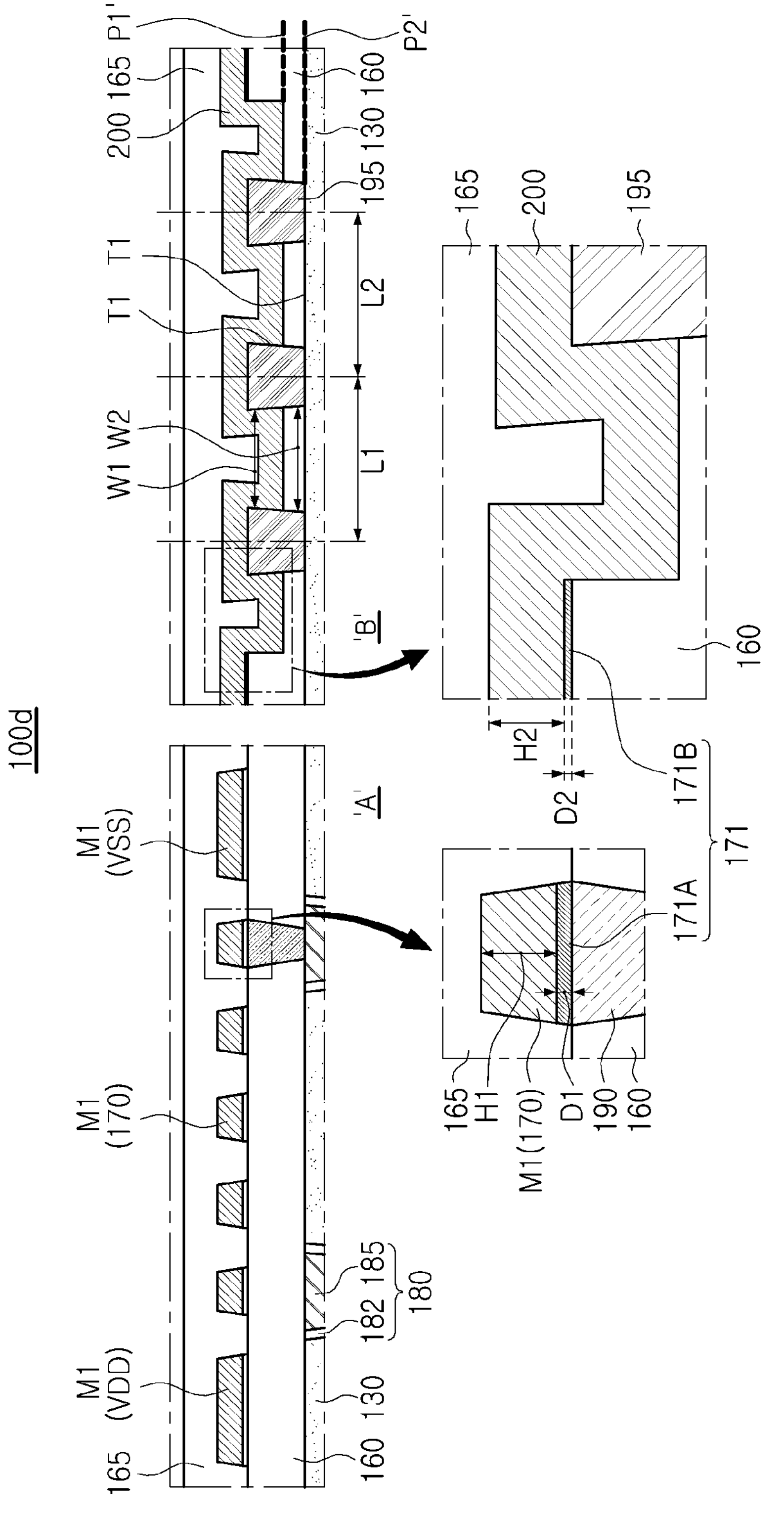

Referring to FIG. 6, in a semiconductor device 100*d*, a level P1' of the lower surface of the dummy wiring layer 200 may be higher than a level P2' of a lower surface of the key patterns 195, unlike the semiconductor device 100 of FIG. 3B. This may be because in the process of FIG. 10D, a subsequent process is performed in a stated in which the first upper interlayer insulating layer 160 remains between the key patterns 195. Even in this case, a path difference of light may be formed by the dummy wiring layer 200 surrounding a portion of the upper surface and the side surface of the key patterns 195 and having the curved structure, thereby aligning the plurality of metal wiring M1, the via structure 190, and the contact structure 180.

Figure 7:
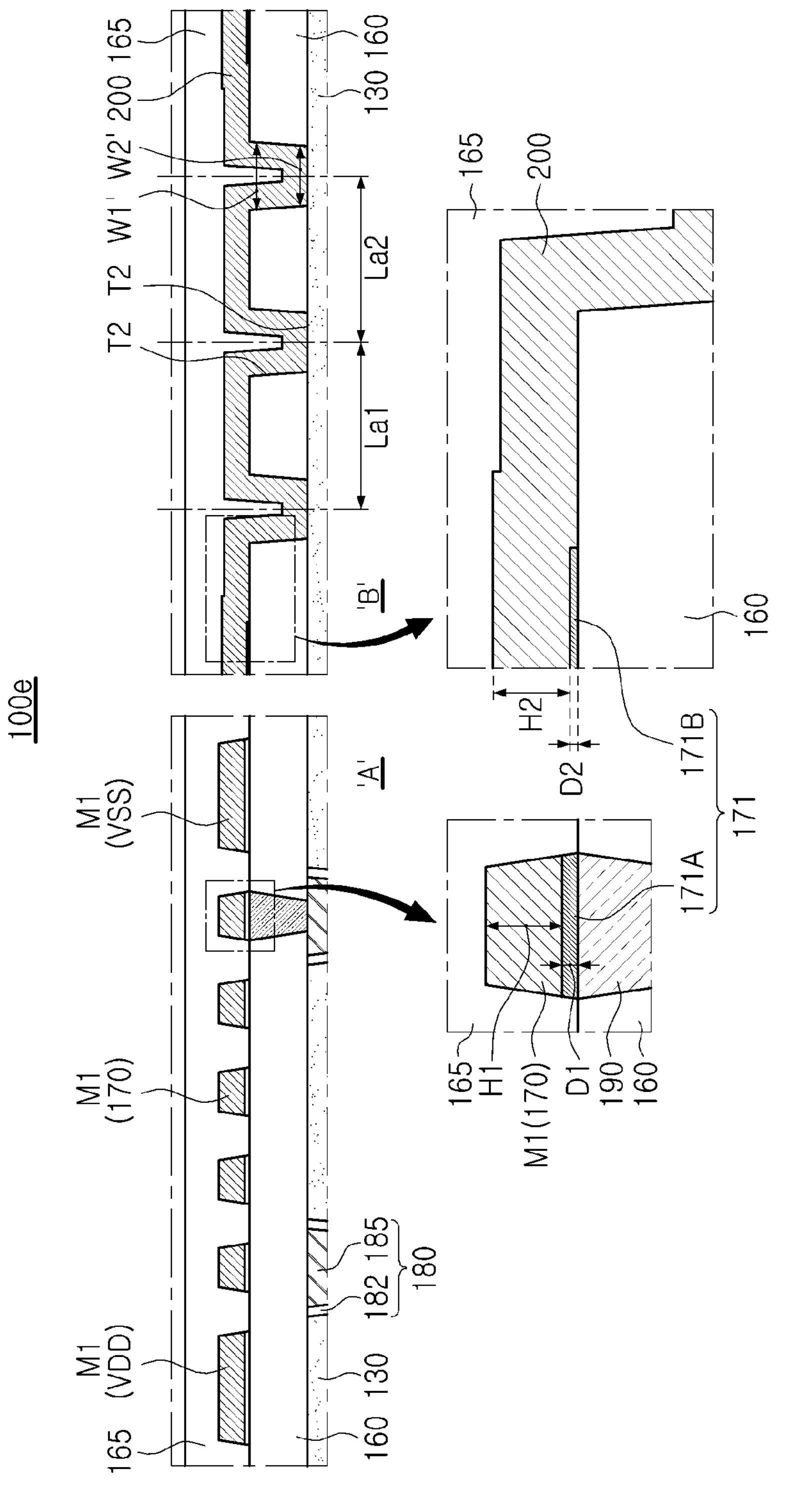

Referring to FIG. 7, a semiconductor device 100*e* may not include the key patterns 195 (see FIG. 3B), unlike the semiconductor device of FIGS. 3B, 3C, 4, 5 and 6. In a process of FIG. 11B, second trenches T2, as regions from which the key patterns 195 are removed, may be formed. The second trenches T2 may be disposed along an internal side surface of the first upper interlayer insulating layer 160 and an upper surface of the lower interlayer insulating layer 130. According to some example embodiments, the dummy wiring layer 200 may be disposed along the second trenches T2 and the upper surface and the side surface of the first upper interlayer insulating layer 160. According to some example embodiments, a width W2' of a lower portion of the second trenches T2 may be less than a width W1' of an upper portion of the second trenches T2.

Figure 8:
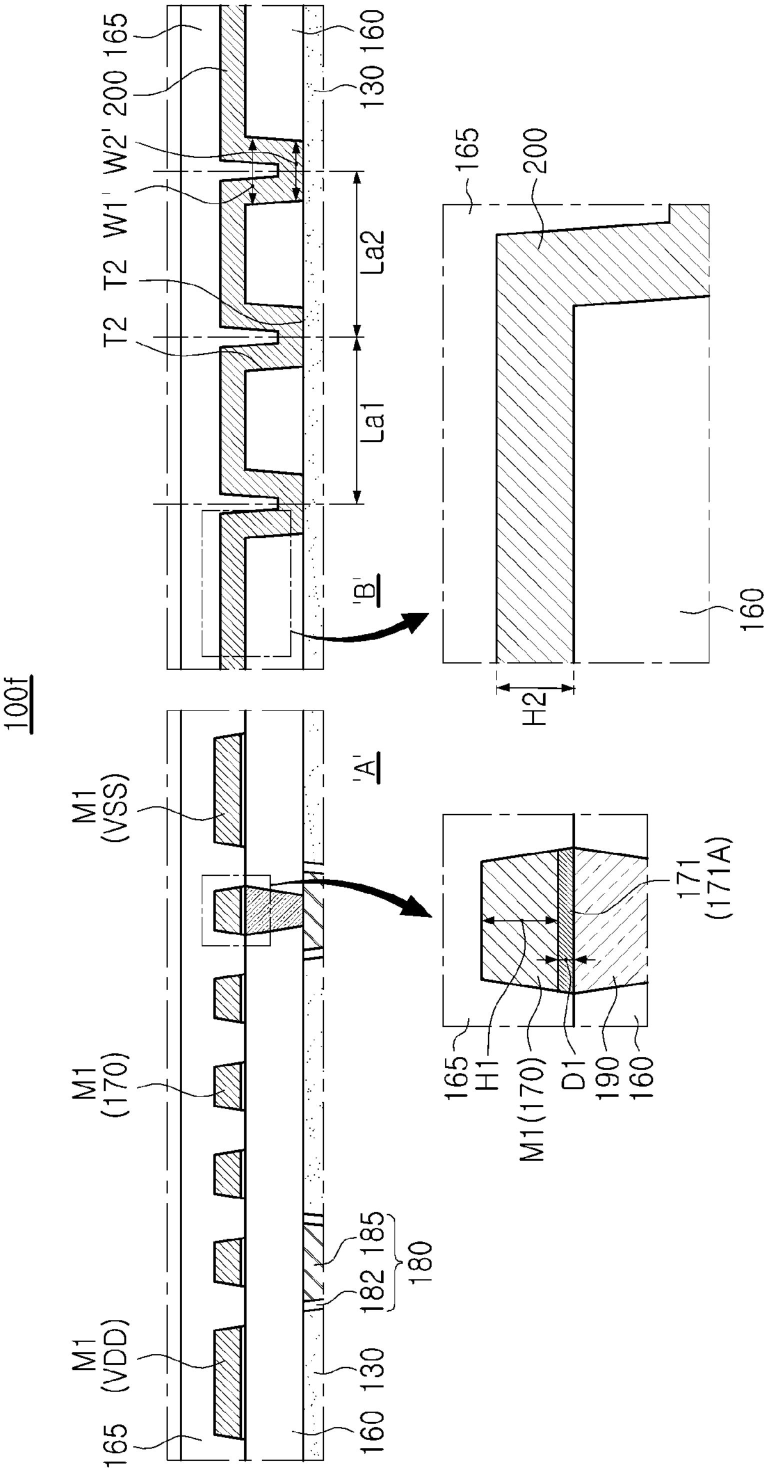

Referring to FIG. 8, in a semiconductor device 100*f*, the stopper layer 171 may not be disposed between the dummy wiring layer 200 and the first upper interlayer insulating layer 160, in the second region R2, unlike the semiconductor device 100*e* of FIG. 7. This may be because a subsequent process is performed in a state in which the second stopper layer 171B of the second region R2 is removed during a process of performing the stripping process or the ashing process as the process of FIG. 11B.

Figure 9:
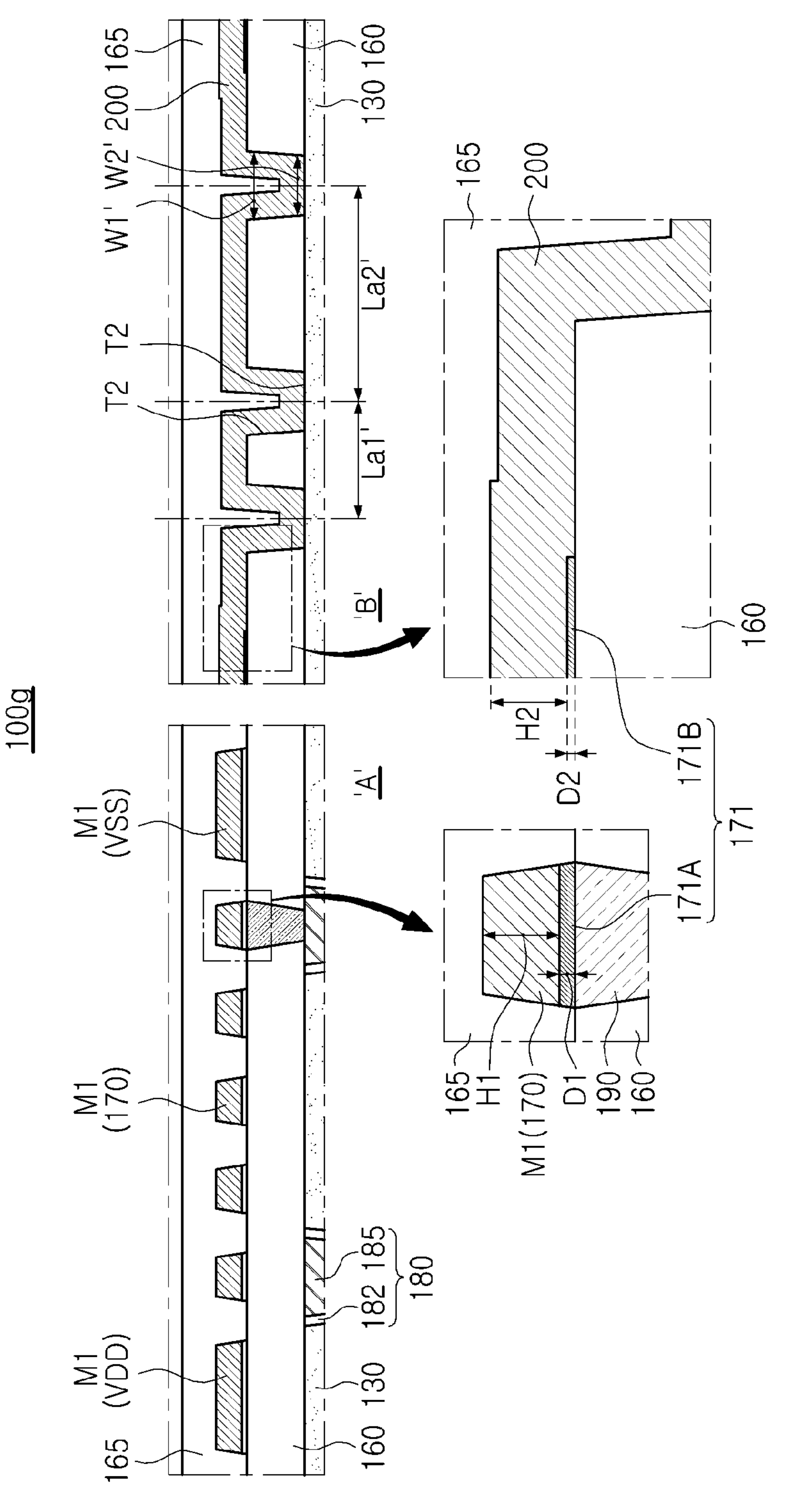

Referring to FIG. 9, a semiconductor device 100*g* may have different distances La1' and La2' between central axes of each of the second trenches T2. The second trenches T2 are formed in a region in which the key patterns 195 existed, and may be formed by the arrangement of the key patterns 195 in the second region R2 of FIG. 2. The dummy wiring layer 200 may surround upper surfaces and side surfaces of the second trenches T2 and the first upper interlayer insulating layer 160, and may have a curved structure.

FIGS. 10A, 10B, 10C, 10D and 10E are FIGS. 10A, 10B, 10C, 10D and 10E are cross-sectional views and partially enlarged views illustrated according to a process order to describe methods of manufacturing semiconductor devices according to some example embodiments. FIG. 10A illustrates a region corresponding to a cross-section taken along a cut line I-I' and a cross-section taken along a cut line II-II' of FIG. 2. FIGS. 10B, 10C, 10D and 10E illustrate regions corresponding to regions 'A' and 'B' of FIG. 3B.

According to FIG. 10A, a substrate 101 having a first region R1 and a second region R2, active fins 105 on substrate 101, a device isolation layer 110 between the active fins 105, a plurality of channel layers 141, 142 and 143, source/drain region 150 on the active fins 105, a lower interlayer insulating layer 130, a contact structure 180 penetrating through the lower interlayer insulating layer 130 and connected to the source/drain region 150, a first upper interlayer insulating layer 160 on the lower interlayer insulating layer 130, and a via structure 190 and key patterns 195 penetrating through the first upper interlayer insulating layer 160 may be formed.

In the first region R1, a gate-all-around type field effect transistor may be formed on an upper surface of the substrate 101. Specifically, the transistor may include the active fins 105, the plurality of channel layers 141, 142 and 143 stacked to be spaced apart from each other on the active fins 105, a gate structure GS (see FIG. 2) intersecting the active fins 105 and the source/drain region 150 disposed on the active fins 105 on both sides of the gate structure (GS, see FIG. 2) and connected to both side surfaces of the plurality of channel layers 141, 142 and 143. A lower interlayer insulating layer 130 covering the source/drain region 150 and the gate structure GS (see FIG. 2) may be further formed.

The first upper interlayer insulating layer 160 may be formed on the lower interlayer insulating layer 130. In the first region R1, the via structure 190 penetrating through the first upper interlayer insulating layer 160 may be formed. In the second region R2, the key patterns 195 penetrating through the first upper interlayer insulating layer 160 may be formed. The key patterns 195 may serve as alignment keys or overlay keys in a subsequent process of forming a plurality of metal wirings M1.

Referring to FIG. 10B, a stopper layer 171 on the via structure 190 and the key patterns 195, a buffer layer 172 on the stopper layer 171, and an anti-reflection layer 173 on the buffer layer 172 may be sequentially formed. A photoresist layer PR may be formed on the anti-reflection layer 173.

In the second region R2, a portion of the photoresist layer PR may be removed to form an open region OP. The open region OP may be formed by exposing the photoresist layer PR. For example, a light source of exposure may be a light source capable of emitting a KrF excimer laser (248 nm), but the present disclosure is not limited thereto. The anti-reflection layer 173 may serve as an anti-reflection function in a process of forming the open region OP. For example, the anti-reflection layer 173 may reduce reflection that may interfere with a pattern transfer process. The anti-reflective layer 173 may be, for example, an anti-reflective layer 173 formed using a Bottom of Anti-reflective Coating (BARC) composition. The anti-reflection layer 173 may serve to facilitate adhesion to the photoresist layer PR.

Referring to FIG. 10C, the photoresist layer PR may be removed from the first region R1 and the second region R2, the anti-reflection layer 173, the buffer layer 172, and the stopper layer 171 may be removed in a region vertically overlapping the open region OP, and an upper surface of the key patterns 195 may be exposed to form trenches T.

In a process of forming the trenches T, at least a portion of the first upper interlayer insulating layer 160 may be removed. A side surface of the key patterns 195 may be exposed. The anti-reflection layer 173, the buffer layer 172, the stopper layer 171, and the first upper interlayer insulation layer 160 may be removed, for example, by a dry etch process.

Referring to FIG. 10D, the anti-reflection layer 173 and the buffer layer 172 may be removed in a region except for the open region OP (see FIG. 10B), and at least a portion of the stopper layer 171 may be removed.

The anti-reflection layer 173, the buffer layer 172, and the stopper layer 171 may be removed, for example, by performing a stripping process or an ashing process. The anti-reflection layer 173, the buffer layer 172, and the stopper layer 171 may be removed, for example, using a solution containing $H_2O_2$, $H_2SO_4$, and the like, or may be removed using gases such as $O_2$, $N_2$, $H_2$, and the like. In the process of performing the stripping process or the ashing process, the buffer layer 172 may prevent or reduce in likelihood residues from occurring. The buffer layer 172 may include, for example, at least one of an oxide, a nitride, and/or an oxynitride. In the second region R2, in the process of performing the stripping process or the ashing process, a portion of the first upper interlayer insulating layer 160 may be removed to form first trenches T1. According to some example embodiments, in the process of forming the first trenches T1, at least a portion of the first upper interlayer insulating layer 160 may be removed.

In the first region R1, a first stopper layer 171A may serve to prevent or reduce in likelihood damage to the first upper interlayer insulating layer 160 and the via structure 190. Furthermore, the first stopper layer 171A may improve the electrical characteristics of the semiconductor device 100 by facilitating adhesion with the plurality of metal wirings M1.

At least a portion of the second stopper layer 171B may be removed by the stripping process or the ashing process. According to some example embodiments, a thickness D1 of the first stopper layer 171A may be thicker than a thickness D2 of the second stopper layer 171B, but the present disclosure is not limited thereto. The semiconductor device 100*b* of FIG. 4 may be manufactured when a subsequent process is performed with the second stopper layer 171B removed, by the stripping process or the ashing process. The stopper layer 171 may include, for example, metal nitrides such as titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and tungsten nitride (WN).

Referring to FIG. 10E, a metal wiring layer 200' may be formed in the first region R1, and a dummy wiring layer 200 may be formed in the second region R2. The metal wiring layer 200' and the dummy wiring layer 200 may be formed by a single process. The metal wiring layer 200' and the dummy wiring layer 200 may include the same material. However, example embodiments are not limited thereto. The metal wiring layer 200' may be formed to cover the first stopper layer 171A. The dummy wiring layer 200 may be formed along an upper surface and a side surface of the first upper interlayer insulating layer 160 and the first trenches T1. The metal wiring layer 200' and the dummy wiring layer 200 may be formed by, for example, a PVD process or a CVD process.

According to some example embodiments, in the second region R2, the dummy wiring layer 200 may be formed along an upper surface and a side surface of the key patterns 195. The dummy wiring layer 200 may have a curved structure. A portion of the upper surface of the dummy wiring layer 200 may be disposed on a lower level than that of the upper surface of the key patterns 195.

Next, referring to FIGS. 3A and 3B together, in the first region R1, a portion of the metal wiring layer 200' may be removed by, for example, a subtractive etching process, thus forming a plurality of metal wirings M1. In the process of forming the plurality of metal wirings M1, the key patterns 195 in the second region R2 may be used as alignment keys or overlay keys to electrically connect the via structure 190 and the contact structure 180. Due to the dummy wiring layer 200 covering the upper surface and the side surface of the key patterns 195 and having a curved structure, the dummy wiring layer 200 has a step portion, and when there is exposure for alignment, the path difference of light reflected around the key patterns 195 may be formed. For this reason, the semiconductor device 100 with improved electrical characteristics may be provided by aligning the plurality of metal wirings M1, the via structure 190, and the contact structure 180.

Figure 11A:
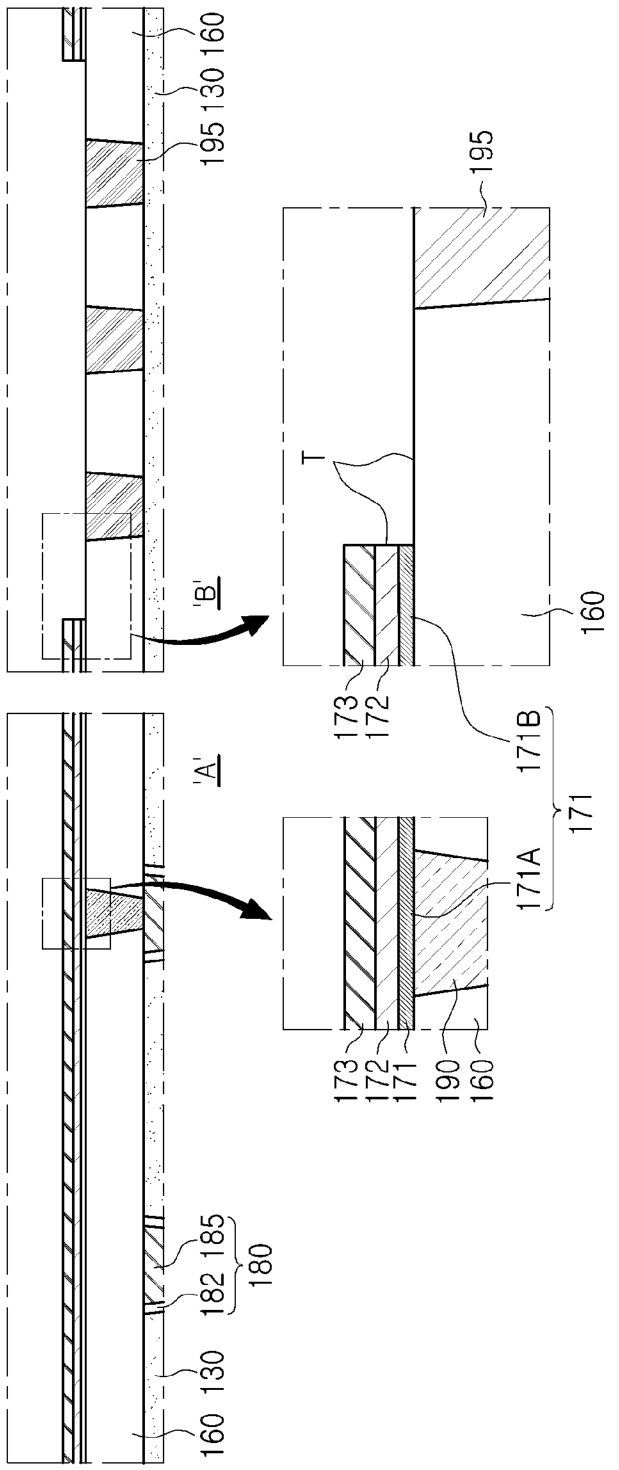
FIGS. 11A, 11B and 11C are cross-sectional views illustrated according to a process order to describe a method of manufacturing a semiconductor device according to some example embodiments.
Figure 11B:
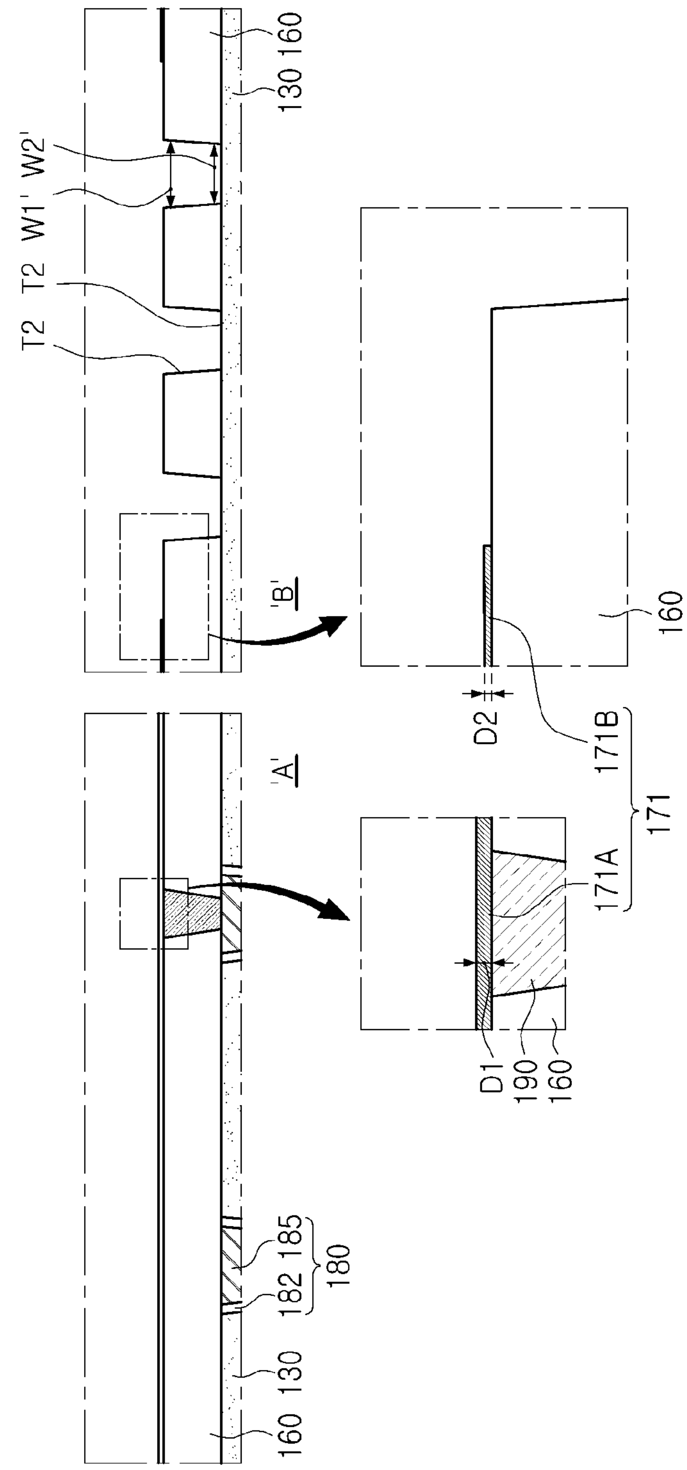
Figure 11C:
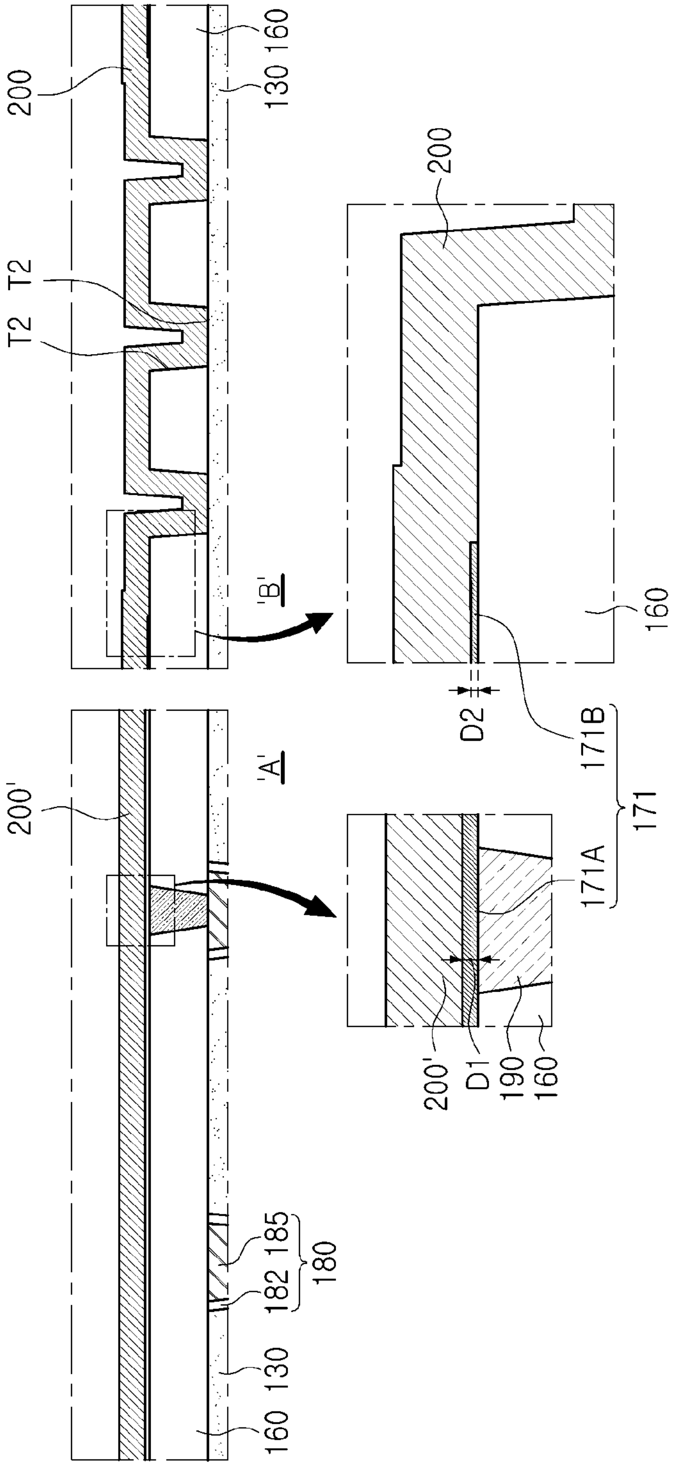

FIGS. 11A, 11B and 11C are cross-sectional views illustrated according to a process order to describe a method of manufacturing a semiconductor device according to some example embodiments. FIGS. 11A, 11B and 11C illustrate regions corresponding to regions 'A' and 'B' of FIG. 7.

First, the same process as those of FIGS. 10A and 10B described above may be performed.

Referring to FIG. 11A, some of the above-described processes may be performed in the same manner with reference to FIG. 10C. According to some example embodiments, in a second region R2, an upper surface of a first upper interlayer insulating layer 160 and an upper surface of key patterns 195 may form a substantially coplanar surface, but the present disclosure is not limited thereto.

Referring to FIG. 11B, the key patterns 195 may be removed from the second region R2 after some of the processes described with reference to FIG. 10D are performed in the same manner.

Exposed key patterns 195 may be selectively removed from a stopper layer 171 and the first upper interlayer insulating layer 160, for example by a wet etching process. Second trenches T2 may be formed along a region from which the key patterns 195 are removed.

Referring to FIG. 11C, some of the above-described processes with reference to FIG. 10E may be performed in the same manner, thus forming a metal wiring layer 200' in the first region R1 and a dummy wiring layer 200 in the second region R2. After removing the key patterns 195, the dummy wiring layer 200 may be formed along the second trenches T2 as regions in which the key patterns 195 are removed, and the upper surface of the first upper interlayer insulating layer 160. Accordingly, the dummy wiring layer 200 may have a curved structure.

Next, referring to FIG. 7 together, in the first region R1, a portion of the metal wiring layer 200' may be removed by, for example, a subtractive etching process, thus forming a plurality of metal wiring M1. In the process of forming the plurality of metal wirings M1, the dummy wiring layer 200 in the second region R2 may be used as alignment keys or overlay keys to electrically connect the via structure 190 and the contact structure 180. Due to the dummy wiring layer 200 having a curved structure, the dummy wiring layer 200 has a step portion, and when there is exposure for alignment, the path difference of light reflected around the second trenches T2 from which the key patterns 195 are removed may be formed. For this reason, the semiconductor device 100*e* with improved electrical characteristics may be provided by aligning the plurality of metal wirings M1, the via structure 190, and the contact structure 180.

The present disclosure is not limited to the above-described example embodiments and the accompanying drawings but is defined by the appended claims. Therefore, those of ordinary skill in the art may make various replacements, modifications, or changes without departing from the scope of the present disclosure defined by the appended claims, and these replacements, modifications, or changes should be construed as being included in the scope of the present disclosure.

What is claimed is:

1. A semiconductor device comprising:

a substrate having a first region and a second region;

an active region extending in a first direction on the first region of the substrate;

a device isolation layer on the first region and the second region of the substrate and configured to define the active region in the first region;

a gate structure on the active region and extending in a second direction, intersecting the first direction;

a source/drain region on the active region on both sides of the gate structure;

a lower interlayer insulating layer on the device isolation layer and configured to cover the gate structure and the source/drain region in the first region;

a contact structure penetrating through the lower interlayer insulating layer and connected to the source/drain region;

a first upper interlayer insulating layer configured to cover the lower interlayer insulating layer and the contact structure;

a via structure on the first upper interlayer insulating layer and connected to the contact structure;

a plurality of metal wirings extending in the first direction on the first upper interlayer insulating layer and electrically connected to the via structure;

a first stopper layer in contact with lower surfaces of the plurality of metal wirings and between the lower surfaces of the plurality of metal wirings and an upper surface of the via structure;

key patterns on a same level and made of a same material as that of the via structure, in the second region;

a dummy wiring layer configured to cover the key patterns and have a curved structure along the first upper interlayer insulating layer and the key patterns; and a second upper interlayer insulating layer on the first upper interlayer insulating layer and configured to cover side surfaces of the plurality of metal wirings and the dummy wiring layer.

2. The semiconductor device of claim 1, further comprising:

a second stopper layer below the dummy wiring layer and in contact with at least a portion of a lower surface of the dummy wiring layer, wherein the first stopper layer is between the plurality of metal wirings and the first upper interlayer insulating layer.

3. The semiconductor device of claim 2, wherein a thickness of the first stopper layer is greater than a thickness of the second stopper layer.

4. The semiconductor device of claim 1, wherein distances between central axes of each of the key patterns are different from each other.

5. The semiconductor device of claim 1, wherein a level of a portion of a lower surface of the dummy wiring layer is a same level as a level of a lower surface of the key patterns.

6. The semiconductor device of claim 1, wherein a level of a lower surface of the dummy wiring layer is higher than a level of a lower surface of the key patterns.

7. The semiconductor device of claim 1, wherein a width of an upper portion of each of the key patterns is greater than a width of a lower portion of each of the key patterns.

8. The semiconductor device of claim 1, wherein a thickness of the dummy wiring layer is a same thickness as a thickness of the plurality of metal wirings.

9. The semiconductor device of claim 1, wherein a side surface of the first stopper layer and a side surface of each of the plurality of metal wirings form a coplanar surface.

10. The semiconductor device of claim 1, further comprising:

a plurality of channel layers on the active region and spaced apart from each other in a vertical direction, perpendicular to an upper surface of the substrate.

11. The semiconductor device of claim 1, wherein the first region is a cell region, and the second region is a region including at least one of a peripheral circuit region and a scribe lane region.

12. The semiconductor device of claim 1, wherein the second region includes at least one of an alignment key region and an overlay key region.

13. A semiconductor device comprising:

a substrate having a first region and a second region;

a lower interlayer insulating layer on the first region and the second region of the substrate;

an upper interlayer insulating layer on the lower interlayer insulating layer;

a via structure penetrating through the upper interlayer insulating layer in the first region;

a plurality of metal wirings extending in a first direction on the via structure and electrically connected to the via structure;

trenches on a same level as that of the via structure and in the upper interlayer insulating layer, in the second region;

key patterns on the lower interlayer insulating layer on a same level and made of a same material as that of the via structure, in the second region; and a dummy wiring layer having a curved structure along the trenches, the upper interlayer insulating layer, and an upper surface of the lower interlayer insulating layer.

14. The semiconductor device of claim 13, further comprising:

a first stopper layer in contact with lower surfaces of the plurality of metal wirings and between the lower surfaces of the plurality of metal wirings and an upper surface of the via structure;

a second stopper layer below the dummy wiring layer and in contact with at least a portion of the lower surface of the dummy wiring layer;

wherein the trenches further include first trenches between the key patterns, and the dummy wiring layer is disposed along the first trenches and an upper surface and a side surface of the key patterns.

15. The semiconductor device of claim 14, wherein a width of lower portions of the first trenches is greater than a width of upper portions of the first trenches.

16. The semiconductor device of claim 13, wherein the trenches further include second trenches disposed along an internal side surface of the upper interlayer insulating layer and the upper surface of the lower interlayer insulating layer, and the dummy wiring layer is disposed along the second trenches and the upper surface and a side surface of the upper interlayer insulating layer.

17. The semiconductor device of claim 16, wherein a width of lower portions of the second trenches is less than a width of upper portions of the second trenches.

18. A method of manufacturing a semiconductor device, the method comprising:

forming a lower interlayer insulating layer on a substrate having a first region and a second region;

forming an upper interlayer insulating layer on the lower interlayer insulating layer;

forming a via structure penetrating through the upper interlayer insulating layer, in the first region;

forming key patterns penetrating through the upper interlayer insulating layer on a same level and made of a same material as that of the via structure, in the second region;

sequentially forming a stopper layer on the via structure and the key patterns, a buffer layer on the stopper layer, and an anti-reflection layer on the buffer layer;

forming a photoresist layer on the anti-reflection layer;

forming an open region by removing a portion of the photoresist layer, in the second region;

forming trenches by removing the photoresist layer in the first region and second region, and removing the anti-reflection layer, the buffer layer and the stopper layer in a region vertically overlapping the open region, and exposing an upper surface of the key patterns;

removing the anti-reflection layer and the buffer layer in regions except for the open region, and removing at least a portion of the stopper layer;

forming a metal wiring layer covering the stopper layer, in the first region;

forming a dummy wiring layer along an upper surface and a side surface of the upper interlayer insulating layer and the trenches, in the second region; and forming a plurality of metal wirings by removing a portion of the metal wiring layer, in the first region.

19. The method of manufacturing a semiconductor device of claim 18, wherein the forming trenches comprises:

removing at least a portion of the upper interlayer insulating layer, wherein the dummy wiring layer is formed along an upper surface and a side surface of the key patterns, and a portion of an upper surface of the dummy wiring layer is on a lower level than that of the upper surface of the key patterns.

20. The method of manufacturing a semiconductor device of claim 18, further comprising:

removing the key patterns, after the forming trenches by exposing an upper surface of the key patterns, wherein the dummy wiring layer is formed along a region from which the key patterns are removed, after the removing the key patterns.

* * * * *